United States Patent
Marbell et al.

(10) Patent No.: US 12,525,930 B2
(45) Date of Patent: Jan. 13, 2026

(54) TRANSISTOR AMPLIFIER WITH PCB ROUTING AND SURFACE MOUNTED TRANSISTOR DIE

(71) Applicant: MACOM Technology Solutions Holdings, Inc., Lowell, MA (US)

(72) Inventors: Marvin Marbell, Cary, NC (US); Jeremy Fisher, Raleigh, NC (US); Haedong Jang, San Jose, CA (US); Daniel Namishia, Wake Forest, NC (US); Daniel Etter, Durham, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 671 days.

(21) Appl. No.: 17/934,698

(22) Filed: Sep. 23, 2022

(65) Prior Publication Data

US 2024/0106397 A1    Mar. 28, 2024

(51) Int. Cl.
| | | |
|---|---|---|
| *H03F 3/187* | (2006.01) | |
| *H01L 23/66* | (2006.01) | |
| *H03F 1/56* | (2006.01) | |
| *H03F 3/195* | (2006.01) | |
| *H03F 3/24* | (2006.01) | |

(52) U.S. Cl.
CPC ............. *H03F 3/195* (2013.01); *H01L 23/66* (2013.01); *H03F 1/565* (2013.01); *H03F 3/245* (2013.01); *H01L 2223/6611* (2013.01); *H01L 2223/6655* (2013.01); *H03F 2200/451* (2013.01)

(58) Field of Classification Search
CPC ...................................................... H03F 3/187
USPC ......................................................... 330/307
See application file for complete search history.

(56) References Cited

U.S. PATENT DOCUMENTS

| | | |
|---|---|---|
| 5,192,987 A | 3/1993 | Khan et al. |
| 5,210,051 A | 5/1993 | Carter |
| 5,296,395 A | 3/1994 | Khan et al. |
| 5,393,993 A | 2/1995 | Edmond et al. |
| 5,523,589 A | 6/1996 | Edmond et al. |
| 6,316,793 B1 | 11/2001 | Sheppard et al. |
| 6,548,333 B2 | 4/2003 | Smith |
| 7,030,428 B2 | 4/2006 | Saxler |
| 7,045,404 B2 | 5/2006 | Sheppard et al. |
| 7,544,963 B2 | 6/2009 | Saxler |
| 7,548,112 B2 | 6/2009 | Sheppard |

(Continued)

FOREIGN PATENT DOCUMENTS

| | | |
|---|---|---|
| CN | 103579477 A | 2/2014 |
| JP | 2009278121 A | 11/2009 |
| WO | 2021202358 A1 | 10/2021 |

OTHER PUBLICATIONS

Notification of Transmittal of the International Search Report and the Written Opinion of the International Searching Authority, or the Declaration, in corresponding PCT Application No. PCT/US2023/074159 (Feb. 7, 2024).

*Primary Examiner* — Henry Choe
(74) *Attorney, Agent, or Firm* — Myers Bigel, P.A.

(57) ABSTRACT

A transistor amplifier package includes a package substrate comprising conductive patterns exposed by solder mask patterns at a surface thereof, and at least one transistor die comprising a semiconductor structure attached to the surface of the package substrate by a solder material and aligned by the solder mask patterns such that respective gate, drain, and/or source terminals of the at least one transistor die are electrically connected to respective ones of the conductive patterns. Related transistor amplifiers and fabrication methods are also discussed.

21 Claims, 12 Drawing Sheets

(56) References Cited

U.S. PATENT DOCUMENTS

| | | |
|---|---|---|
| 7,592,211 B2 | 9/2009 | Sheppard et al. |
| 7,615,774 B2 | 11/2009 | Saxler |
| 7,709,269 B2 | 5/2010 | Smith et al. |
| 8,049,252 B2 | 11/2011 | Smith et al. |
| 8,120,064 B2 | 2/2012 | Parikh et al. |
| 2008/0136019 A1 | 6/2008 | Johnson et al. |
| 2021/0313935 A1 | 10/2021 | Noori et al. |
| 2021/0328551 A1 | 10/2021 | Maalouf et al. |
| 2022/0157671 A1 | 5/2022 | Marbell et al. |

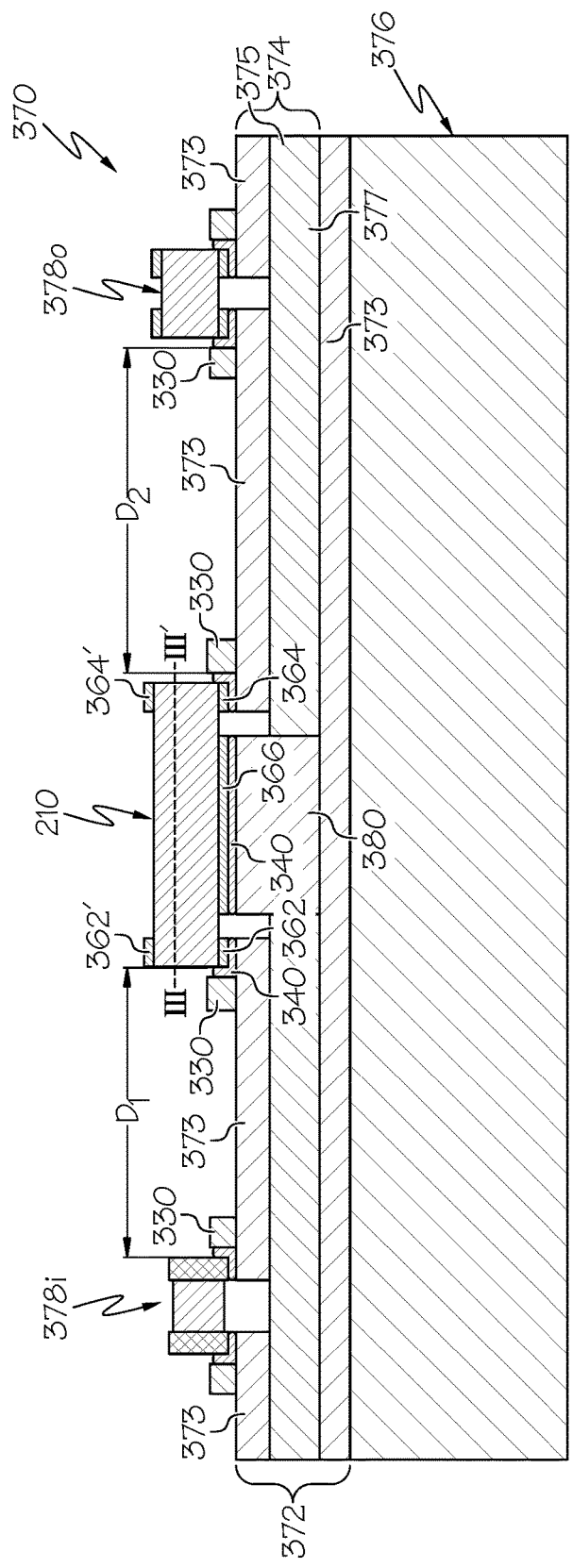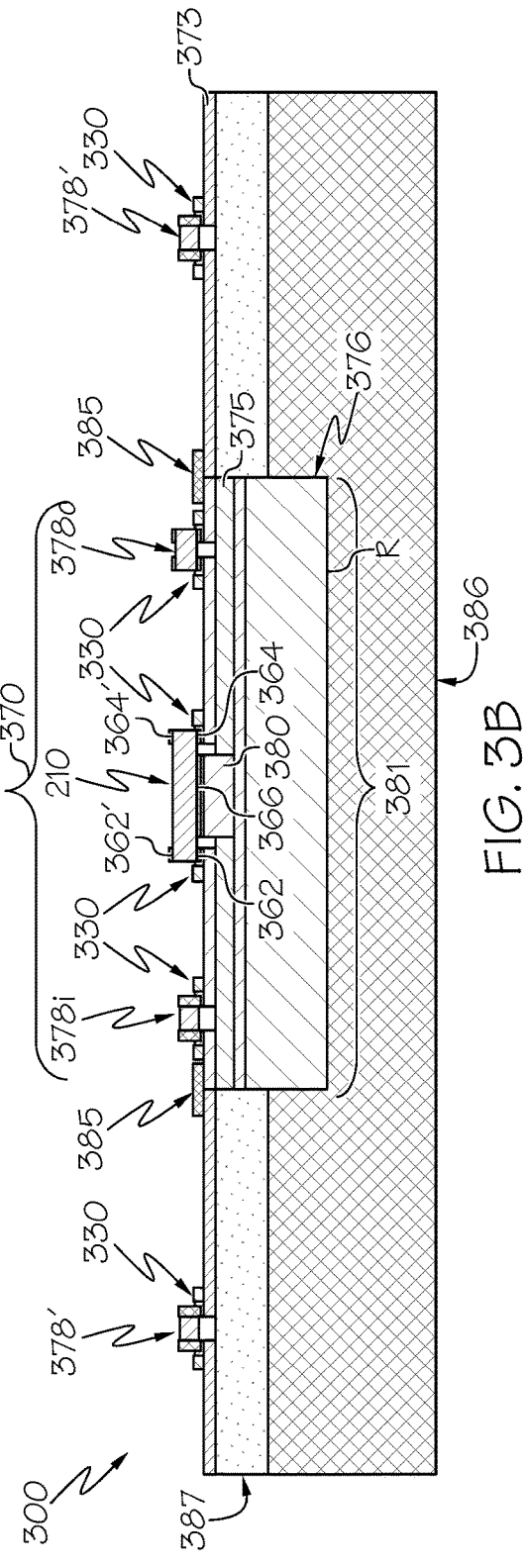

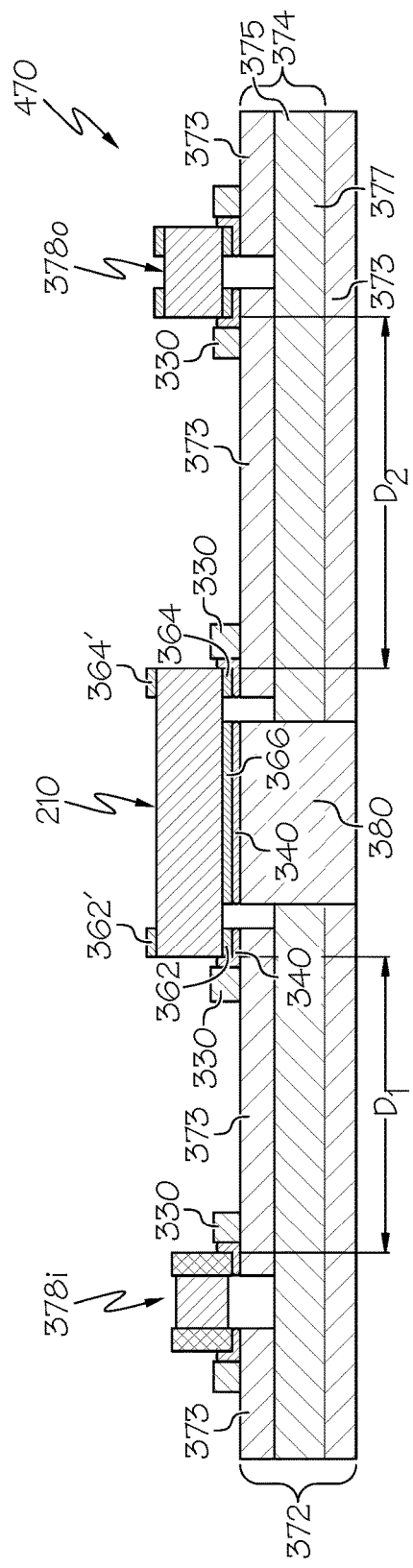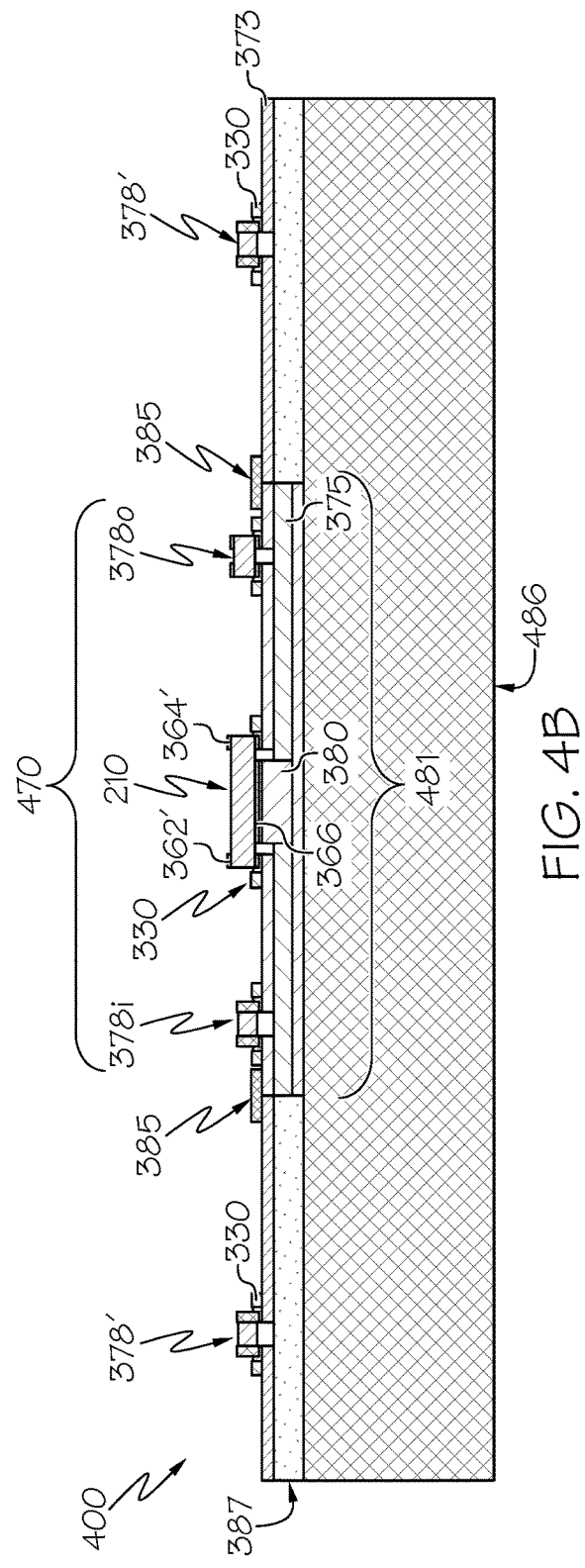

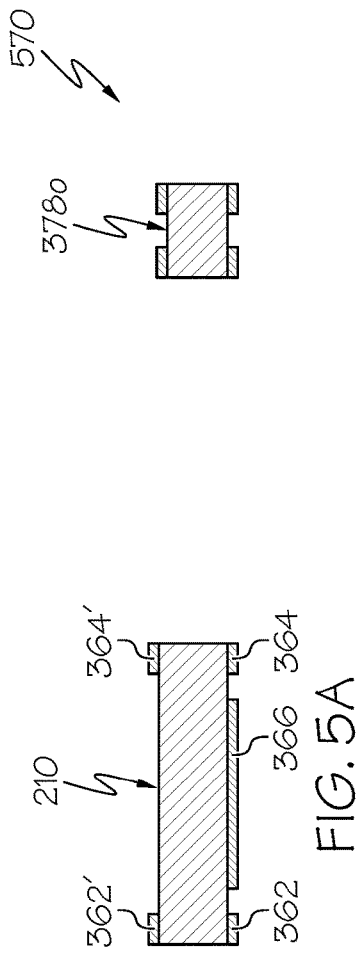
FIG. 5A
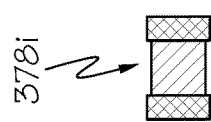
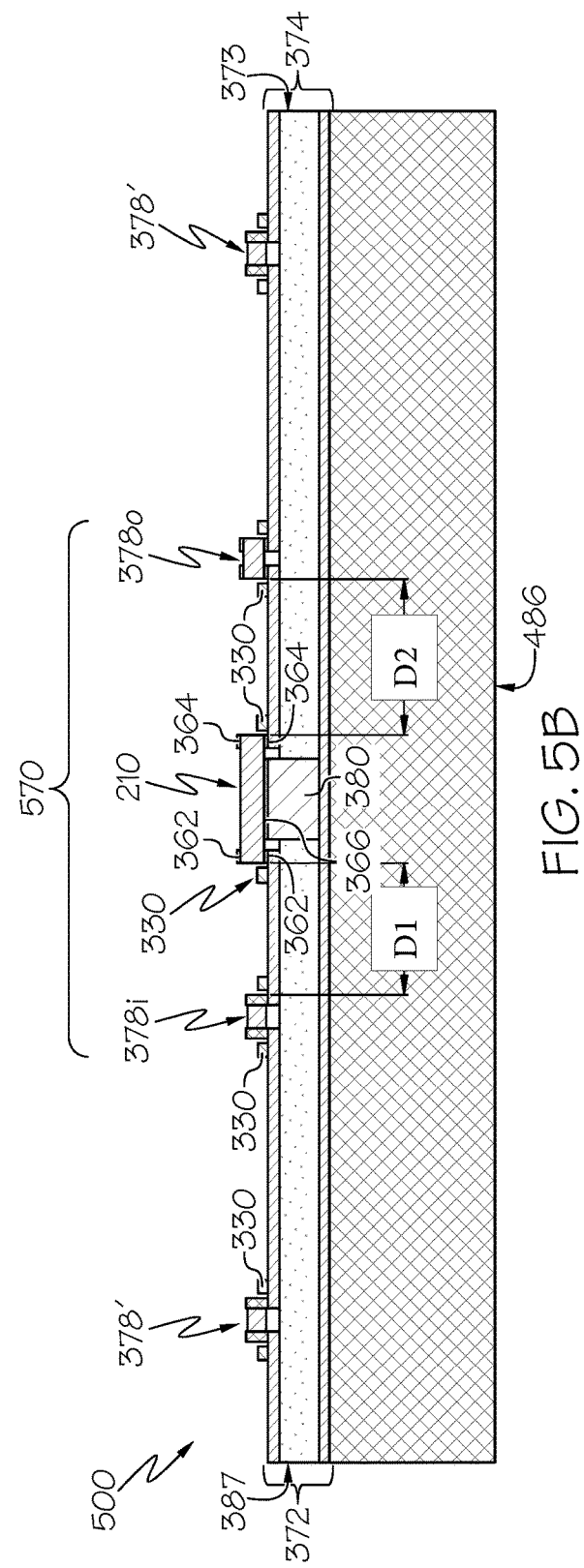
FIG. 5B

TRANSISTOR AMPLIFIER WITH PCB ROUTING AND SURFACE MOUNTED TRANSISTOR DIE

FIELD

The present disclosure relates generally to transistor devices and, more particularly, to radio frequency ("RF") power amplifier devices.

BACKGROUND

Electrical circuits requiring high power handling capability while operating at high frequencies, such as UHF (0.3-1 GHz), L-Band (1-2 GHz), R-band (1.7-2.6 GHz), S-band (2-4 GHz) and X-band (8-12 GHz), have in recent years become more prevalent. In particular, there may be high demand for RF power amplifiers that are used to amplify RF signals at radio (including microwave) frequencies. These RF power amplifiers may need to exhibit high reliability, good linearity and handle high output power levels.

RF power amplifiers may be implemented in silicon or using wide bandgap semiconductor materials (i.e., having a band-gap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The Group III elements can combine with nitrogen to form binary (e.g., GaN), ternary (e.g., AlGaN, AlInN), and quaternary (e.g., AlInGaN) compounds. These compounds have empirical formulas in which one mole of nitrogen is combined with a total of one mole of the Group III elements.

Silicon-based RF power amplifiers are typically implemented using laterally diffused metal oxide semiconductor ("LDMOS") transistors. Silicon LDMOS RF power amplifiers can exhibit high levels of linearity and may be relatively inexpensive to fabricate. Group III nitride-based RF power amplifiers are typically implemented using High Electron Mobility Transistors ("HEMT") and are primarily used in applications requiring high power and/or high frequency operation where LDMOS RF power amplifiers may have inherent performance limitations.

RF power amplifiers may include one or more amplification stages, with each stage typically implemented as a transistor amplifier. In order to increase output power and current handling capabilities, RF power amplifiers are typically implemented in a "unit cell" configuration in which a large number of individual "unit cell" transistor structures are arranged electrically in parallel. An RF power amplifier may be implemented as a single integrated circuit chip or "die," or may include a plurality of dies. A die or chip may refer to a small block of semiconducting material or other substrate on which electronic circuit elements are fabricated. When multiple RF transistor dies are used, they may be connected in series and/or in parallel.

RF power amplifiers often include matching circuits, such as (i) impedance matching circuits that are designed to improve the impedance match between the active transistor die (e.g., including MOSFETs, HEMTs, LDMOS, etc.) and transmission lines connected thereto for RF signals at the fundamental operating frequency, and (ii) harmonic termination circuits that are designed to at least partly terminate harmonics that may be generated during device operation, such as second and third order harmonics. Termination of harmonics also influences generation of intermodulation distortion products.

The RF transistor die(s) as well as the impedance matching and/or harmonic termination circuits may be enclosed in an integrated circuit device package. Integrated circuit packaging may refer to encapsulating one or more dies in a supporting case or package that protects the dies from physical damage and/or corrosion, and supports the electrical contacts for connection to external circuits. The input and output impedance matching circuits in an integrated circuit device package typically include inductor-capacitor (LC) networks that provide at least a portion of an impedance matching circuit that is configured to match the impedance of the active transistor die to a fixed value. The package typically includes an electrically conductive attachment surface or "flange" on which the dies are mounted, and an electrically insulating protective material, such as plastic or ceramic, that seals and protects the dies from moisture and dust particles. Electrically conductive leads (also referred to herein as package leads or RF leads) may extend from the package, and are used to electrically connect the RF transistor amplifier to external circuit elements such as input and output RF transmission lines and bias voltage sources.

As noted above, Group III nitride-based RF power amplifiers are often used in high power and/or high frequency applications. Typically, high levels of heat are generated within the Group III nitride-based RF transistor die(s) during operation. If the RF transistor die(s) become too hot, the performance (e.g., output power, efficiency, linearity, gain, etc.) of the RF transistor amplifier may deteriorate and/or the RF transistor die(s) may be damaged. As such, Group III nitride-based RF power amplifiers are typically mounted in packages that may be optimized for heat removal.

In some package designs, the flange of the package includes a thermally conductive substrate, also referred to herein as a "heat slug" or "heat sink." A package level heat slug is designed to pull heat away from the integrated circuits and toward an external heat sink. Typically, the heat slug is formed from a thermally conductive material (e.g., metal). In some package configurations, the heat slug also serves as an electrical terminal that provides a reference potential (e.g., ground) to the dies that are mounted thereon. For example, the flange may be a CPC (copper, copper-molybdenum, copper laminate structure) or copper flange that provides both an attachment surface for the dies and a heat slug.

One semiconductor package design is a molded design (or "overmold" package), in which a plastic or other non-conductive encapsulant material is molded (e.g., by injection or transfer molding) directly on to the heat slug to form a solid structure that directly contacts and encapsulates the RF transistor dies and/or other integrated circuits and associated electrical connections as well as at least part of the heat slug.

Another semiconductor package design is an "open-air cavity" or "open cavity" package, in which a (typically ceramic) lid is placed and attached over a metal heat slug. The ceramic lid seals an open-air cavity that includes the RF transistor dies and/or other integrated circuits and associated electrical connections.

FIG. 1A is a schematic side view of a conventional open cavity RF power amplifier package 170 (illustrated by way of example as a thermally enhanced package) including a transistor die 110 and matching circuits (illustrated by way of example as chip capacitors 190, 192) attached to an electrically conductive attachment surface or flange provided by a package submount 176. The open cavity package 170 includes a lid member 179 (e.g., a ceramic lid, such as alumina) and sidewall members (e.g., printed circuit board (PCB) 177) on the submount 176. The lid 179 and sidewalls of the PCB 177 seal an open-air cavity that includes the transistor die 110 and/or other integrated circuits and associated electrical connections 125, also referred to herein as components of the package. In the example of FIG. 1A, the PCB 177 provides a "window frame" 175 around the components, and supports conductive layers or traces 173 (e.g., copper cladding) that provide the input and output leads 172 and 174.

FIG. 1B is a schematic side view of the package 170 of FIG. 1A mounted on a RF circuit board 180. The input and output leads 172 and 174 connect the package 170 to respective conductive layers or traces 183 (e.g., copper cladding) on the structure 187 (e.g., a PCB layer) of the connecting RF circuit board 180, and provide RF signal connections to and from the die 110 via the matching circuits 190 and 192. The RF circuit board 180 includes an opening 181 that is sized to accept the flange 176, such that a bottom surface of the flange 176 may contact a heat sink 186, which may be or may be part of a layer supporting the RF circuit board 180.

SUMMARY

According to some embodiments, a transistor amplifier includes a package substrate having conductive patterns exposed by solder mask patterns at a surface thereof, and at least one transistor die including a semiconductor structure having respective gate, drain, and/or source terminals attached and electrically connected to respective ones of the conductive patterns exposed by the solder mask patterns at the surface of the package substrate by a solder material.

According to some embodiments, a transistor amplifier package includes a package substrate having conductive patterns exposed by solder mask patterns at a surface thereof, and at least one transistor die including a semiconductor structure attached to the surface of the package substrate by a solder material and aligned by the solder mask patterns such that respective gate, drain, and/or source terminals of the at least one transistor die are electrically connected to respective ones of the conductive patterns.

In some embodiments, the at least one transistor die includes a patterned backside metal layer on a bottom surface of the semiconductor structure, where the patterned backside metal layer includes the respective gate, drain, and/or source terminals, and a barrier metal layer between the patterned backside metal layer and the solder material on the surface of the substrate.

In some embodiments, the barrier metal layer includes at least one of nickel, titanium, and or an alloy thereof.

In some embodiments, the at least one transistor die includes a plurality of conductive pillars on a top surface of the semiconductor structure adjacent a transistor active region and electrically coupled to the respective gate, drain, and/or source terminals, where the solder material is between the conductive pillars and the surface of the substrate.

In some embodiments, one or more discrete passive electrical components are attached to the surface of the package substrate by the solder material and aligned by the solder mask patterns.

In some embodiments, the one or more discrete passive electrical components and/or the at least one transistor die are spaced apart from one another by respective gaps of less than about 0.25 mm, or about 0.25 mm to about 0.1 mm.

In some embodiments, respective terminals of the one or more discrete passive electrical components are electrically connected to the respective gate, drain, and/or source terminals of the at least one transistor die by the respective ones of the conductive patterns.

In some embodiments, at least one of the respective gate, drain, and/or source terminals is on a top surface of the semiconductor structure adjacent a transistor active region. At least one wire bond electrically connects the at least one of the respective gate, drain, and/or source terminals on the top surface to a respective terminal of the one or more discrete passive electrical components.

In some embodiments, the one or more discrete passive electrical components define a portion of an input, interstage, or output impedance matching circuit or harmonic termination circuit.

In some embodiments, the conductive patterns provide respective leads for RF signal connections that are substantially coplanar with the surface of the package substrate having the at least one transistor die attached thereto.

In some embodiments, the package substrate comprises an electrically insulating member, wherein the respective leads are free of electrical connections that extend substantially beyond edges of the electrically insulating member.

In some embodiments, the conductive patterns comprise an embedded conductive member extending through the electrically insulating member, and the source terminal of the at least one transistor die is attached to the embedded conductive member by the solder material at the surface of the package substrate.

In some embodiments, the package is free of a thermally conductive package submount.

In some embodiments, a thermally conductive package submount includes the package substrate thereon, where the respective leads do not extend substantially beyond edges of the thermally conductive package submount.

In some embodiments, an environmental protection layer conformally extends on one or more surfaces of the at least one transistor die.

In some embodiments, the transistor amplifier package is free of an overmold or lid member on the at least one transistor die.

In some embodiments, the transistor amplifier package is free of wire bonds.

According to some embodiments, a transistor amplifier includes a substrate comprising conductive patterns at a surface thereof, at least one transistor die comprising a semiconductor structure and a patterned backside metal layer on a bottom surface thereof, where the patterned backside metal layer is attached to the surface of the substrate by a solder material such that respective gate, drain, and/or source terminals of the at least one transistor die are electrically connected to respective ones of the conductive patterns, and a barrier metal layer between the patterned backside metal layer and the solder material.

In some embodiments, the barrier metal layer includes at least one of nickel, titanium, and or an alloy thereof.

In some embodiments, the bottom surface is silicon carbide, and the backside metal layer includes gold.

In some embodiments, the conductive patterns are exposed by solder mask patterns at the surface of the substrate and the at least one transistor die is aligned by the solder mask patterns.

In some embodiments, the conductive patterns provide respective leads for RF signal connections that are substantially coplanar with the surface of the substrate having the at least one transistor die attached thereto.

In some embodiments, the substrate includes an electrically insulating member, the conductive patterns include an embedded conductive member extending through the electrically insulating member, and the source terminal of the at least one transistor die is attached to the embedded conductive member by the solder material at the surface of the substrate.

In some embodiments, the substrate is a RF circuit board, and the RF circuit board is mounted on a conductive heat sink member that is electrically coupled to the embedded conductive member opposite the at least one transistor die.

In some embodiments, the substrate is a package substrate of a RF transistor amplifier package, and the leads do not extend beyond edges of the electrically insulating member.

In some embodiments, the transistor amplifier further includes a RF circuit board having an opening therein, where the RF transistor amplifier package is mounted in the opening of the RF circuit board such that the package substrate is confined within the opening.

In some embodiments, one or more conductive surface mount components extend beyond the edges of the electrically insulating member and electrically connect the respective leads to conductive patterns on a surface of the RF circuit board outside the opening.

In some embodiments, the surface of the package substrate is substantially coplanar with the surface of the RF circuit board outside the opening.

In some embodiments, the RF circuit board is mounted on a conductive heat sink member that is exposed by the opening therein.

In some embodiments, the conductive heat sink member includes a substantially planar surface, and the package substrate is mounted on the conductive heat sink member free of a thermally conductive package submount therebetween.

In some embodiments, the RF transistor amplifier package includes a thermally conductive package submount having the package substrate thereon, and the conductive heat sink member includes a recess therein that is sized to accept the thermally conductive package submount.

In some embodiments, the RF circuit board includes fewer or more conductive layers than the one or more conductive layers of the package substrate.

In some embodiments, one or more discrete passive electrical components are attached to the surface of the substrate by the solder material and aligned by the solder mask patterns.

In some embodiments, the one or more discrete passive electrical components and/or the at least one transistor die are spaced apart from one another by respective gaps of less than about 0.25 mm, or about 0.25 mm to about 0.1 mm.

According to some embodiments, a transistor amplifier includes a substrate having conductive patterns exposed by solder mask patterns at a surface thereof and providing respective leads for signal connections, at least one transistor die having a semiconductor structure attached to the surface of the substrate by a solder material, and one or more discrete passive electrical components attached to the surface of the substrate by the solder material. The one or more discrete passive electrical components and/or the at least one transistor die are spaced apart from one another on the surface of the substrate by respective gaps of less than about 0.25 mm.

In some embodiments, the respective gaps are about 0.25 mm to about 0.1 mm, or are about 0.1 mm to about 0.05 mm.

In some embodiments, the one or more discrete passive electrical components define a portion of an input, interstage, or output impedance matching circuit or harmonic termination circuit.

In some embodiments, the conductive patterns provide respective leads for RF signal connections that are substantially coplanar with the surface of the substrate having the at least one transistor die attached thereto.

In some embodiments, the substrate includes an electrically insulating member, the conductive patterns include an embedded conductive member extending through the electrically insulating member, and a terminal of the at least one transistor die is attached to the embedded conductive member by the solder material at the surface of the substrate.

In some embodiments, the substrate is a package substrate of an RF transistor amplifier package, and the respective leads do not extend beyond edges of the electrically insulating member.

In some embodiments, the transistor amplifier includes an RF circuit board having an opening therein, and the RF transistor amplifier package is mounted in the opening of the RF circuit board such that the package substrate is confined within the opening.

In some embodiments, one or more conductive surface mount components extend beyond the edges of the electrically insulating member and electrically connect the respective leads to conductive patterns on a surface of the RF circuit board outside the opening.

According to some embodiments, a method of fabricating transistor amplifier packages includes providing a plurality of package substrates respectively comprising conductive patterns exposed by solder mask patterns at respective surfaces thereof, applying a solder material to the respective surfaces of the package substrates using a stencil thereon, providing at least one transistor die having a semiconductor structure on the respective surfaces of the package substrates, and performing a solder reflow process to attach and align the at least one transistor die on the respective surfaces such that respective gate, drain, and/or source terminals of the at least one transistor die are electrically connected to respective ones of the conductive patterns.

In some embodiments, the at least one transistor die includes a patterned backside metal layer providing the respective gate, drain, and/or source terminals on a bottom surface of the semiconductor structure, and a barrier metal layer thereon. The at least one transistor die is provided on the respective surfaces of the package substrates such that the barrier metal layer is between the patterned backside metal layer and the solder material.

In some embodiments, the barrier metal layer includes at least one of nickel, titanium, and or an alloy thereof.

In some embodiments, the at least one transistor die includes a plurality of conductive pillars on a top surface of the semiconductor structure adjacent a transistor active region and electrically coupled to the respective gate, drain, and/or source terminals. The at least one transistor die is provided such that solder material is between the conductive pillars and the respective surfaces of the package substrates.

In some embodiments, prior to performing the solder reflow process, the method includes providing one or more discrete passive electrical components on the respective surfaces of the package substrates, where the solder reflow process attaches and aligns the one or more discrete passive electrical components on the respective surfaces.

In some embodiments, responsive to performing the solder reflow process, the one or more discrete passive electrical components and/or the at least one transistor die are spaced apart from one another on the respective package substrates by respective gaps of less than about 0.25 mm, or about 0.25 mm to about 0.1 mm.

In some embodiments, the package substrates are connected in a panel, and after performing the solder reflow process, the method includes singulating the panel to define the RF transistor amplifier packages comprising the package substrates, respectively.

In some embodiments, the conductive patterns provide respective leads for RF signal connections that are substantially coplanar with the respective surfaces of the package substrates.

In some embodiments, the package substrates respectively include an electrically insulating member, and, after singulating the panel, the respective leads are free of electrical connections that extend substantially beyond edges of the electrically insulating member.

In some embodiments, the method includes forming an environmental protection layer conformally extending on one or more surfaces of the at least one transistor die.

In some embodiments, the at least one transistor die may be a gallium nitride-based high electron mobility transistor (HEMT).

In some embodiments, the at least one transistor die may be a silicon-based laterally diffused metal oxide semiconductor (LDMOS) transistor.

In some embodiments, the at least one transistor die may be a radio frequency ("RF") transistor die.

In some embodiments, the at least one transistor die may be configured to operate in at least a portion of one or more of the 2.5-2.7 GHz, 3.4-4.2 GHz, or 5.1-5.8 GHz frequency bands.

In some embodiments, the at least one transistor die may be configured to operate at frequencies above 10 GHz.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 3A is a schematic side view of a transistor amplifier package including surface mounted active and passive components in accordance with various embodiments of the present disclosure.

FIG. 3B is a schematic side view of the transistor amplifier package of FIG. 3A mounted on an RF circuit board with electrically conductive shims used for package-board connections in accordance with various embodiments of the present disclosure.

FIG. 4A is a schematic side view of a transistor amplifier package including surface mounted active and passive components in accordance with various embodiments of the present disclosure.

FIG. 4B is a schematic side view of the transistor amplifier package of FIG. 4A mounted on an RF circuit board with electrically conductive shims used for package-board connections in accordance with various embodiments of the present disclosure.

FIG. 5A is a schematic side view of active and passive components of a transistor amplifier in accordance with various embodiments of the present disclosure.

FIG. 5B is a schematic side view of the transistor amplifier and passive components of FIG. 5A mounted on an external RF circuit board in accordance with various embodiments of the present disclosure.

DETAILED DESCRIPTION OF EMBODIMENTS

Figure 1A:
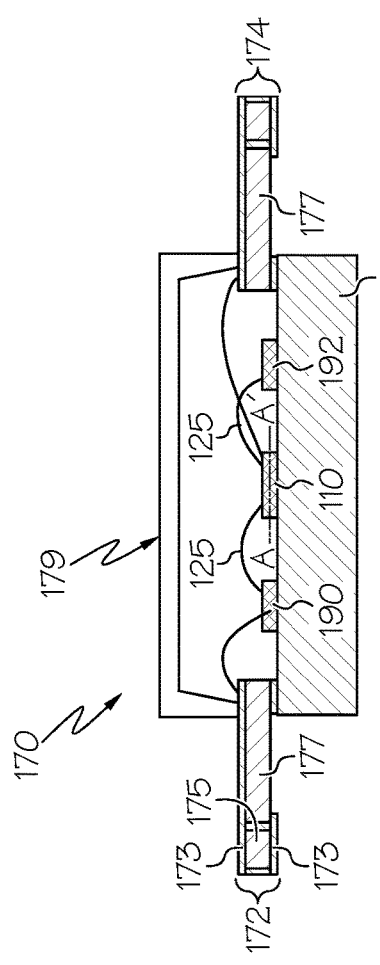
FIG. 1A is a schematic side view of a conventional open cavity transistor amplifier package.
Figure 1B:
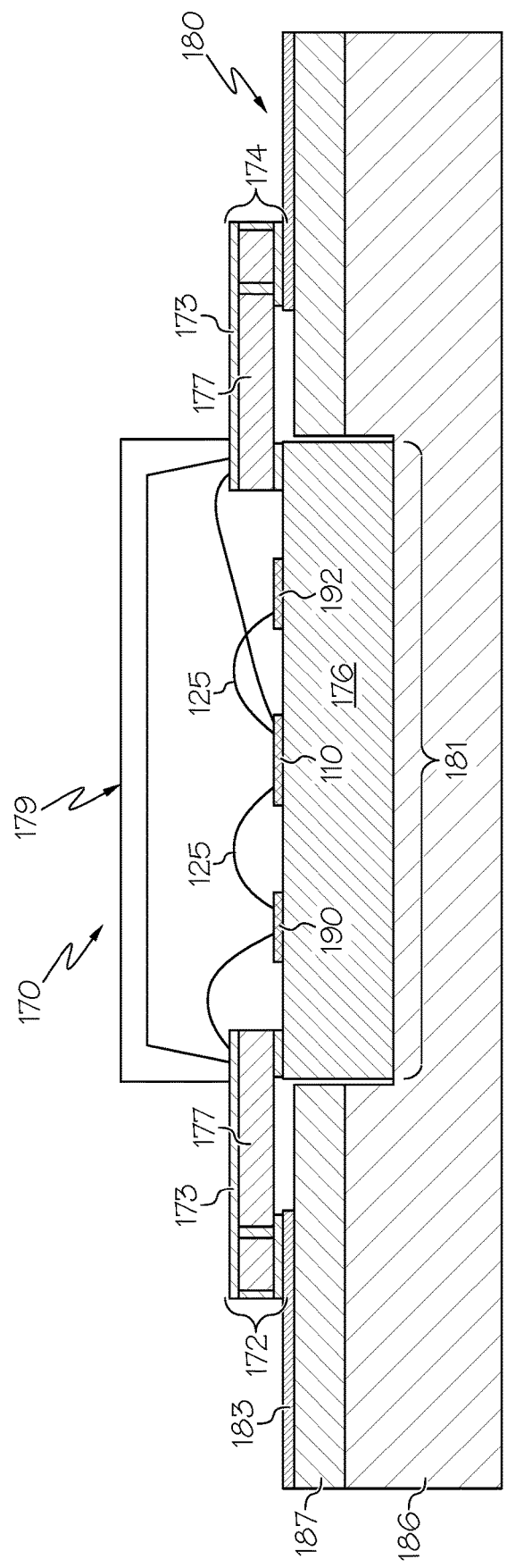
FIG. 1B is a schematic side view of a conventional open cavity Transistor amplifier package mounted on an RF circuit board.
Figure 2A:
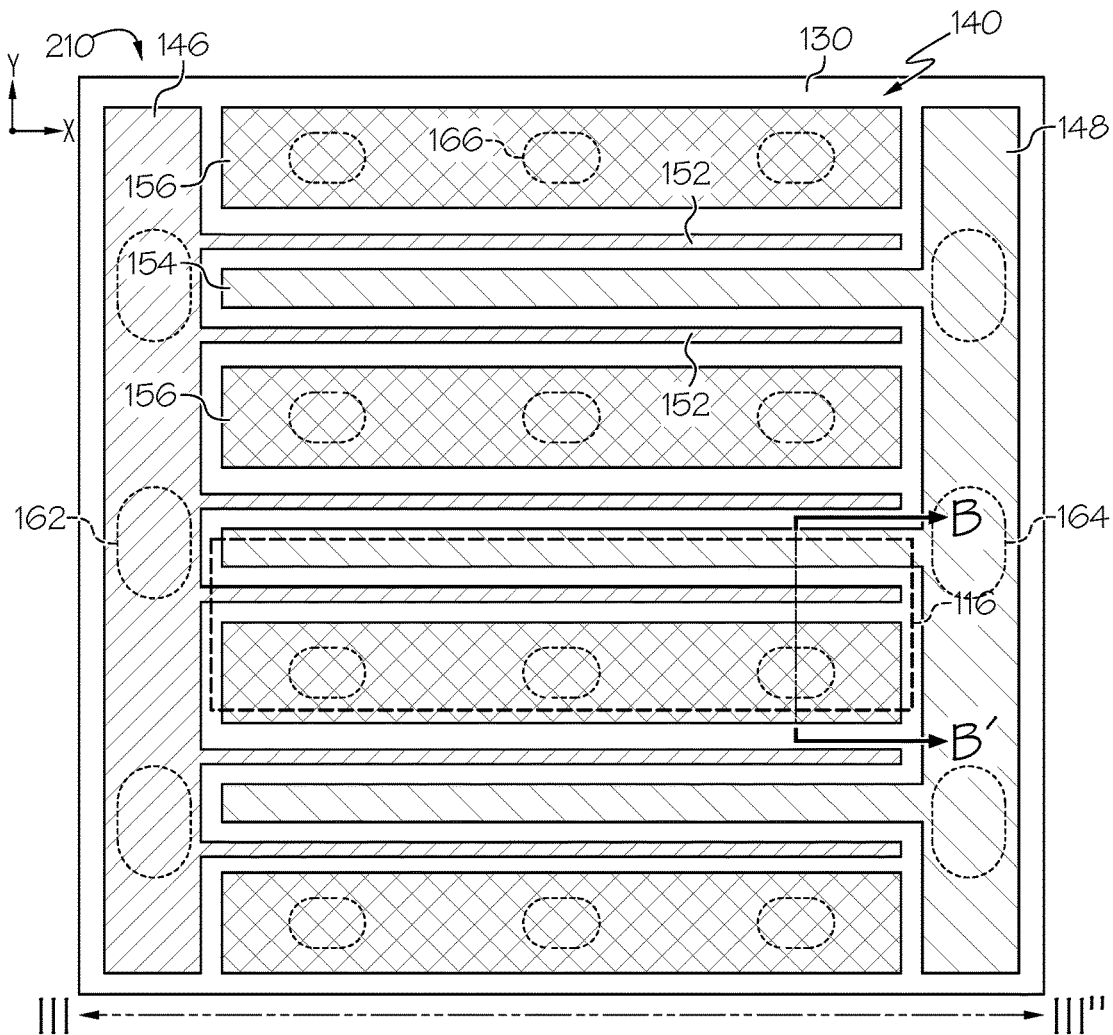
FIG. 2A is a plan view of an RF transistor die in accordance with various embodiments of the present disclosure.
Figure 2B:
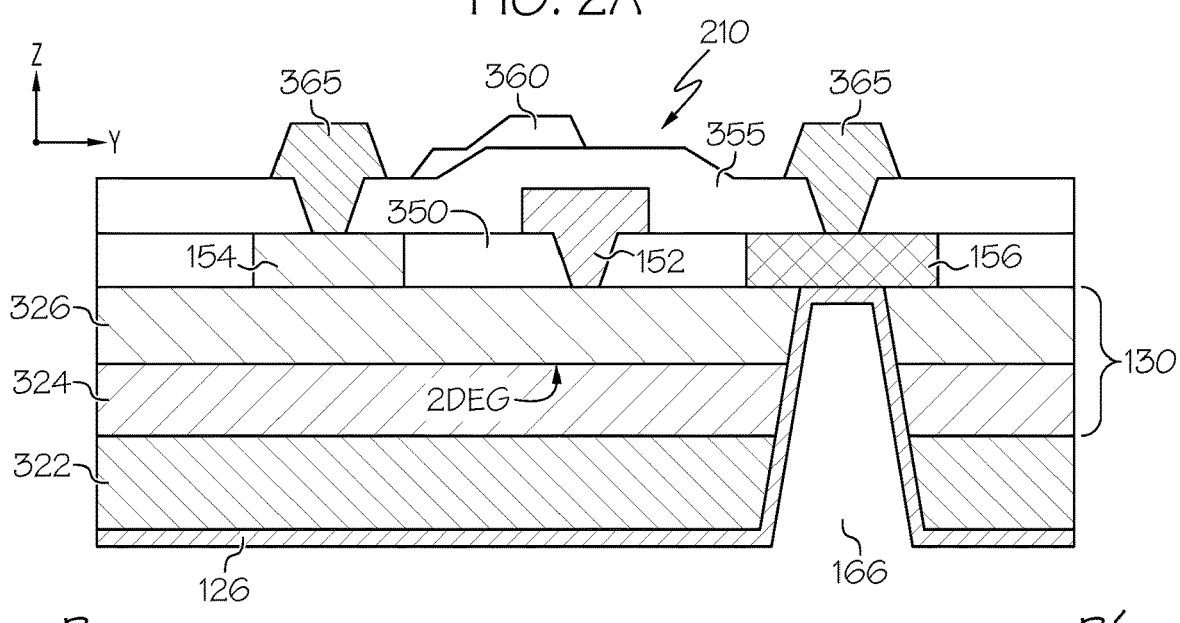
FIG. 2B is a schematic cross-sectional view of a transistor die unit cell in accordance with various embodiments of the present disclosure, where the cross-section is taken along line B-B' of FIG. 2A.

FIG. 2A is a schematic cross-sectional view of a transistor die 210 in accordance with various embodiments of the present disclosure, where the cross-section is taken through a portion of the top side metallization structure of the transistor die 210, e.g., along line of FIG. 3A. Dielectric layers that isolate the various conductive elements of the top-side metallization structure from each other are not shown in FIG. 2A to simplify the drawing. FIG. 2B is a schematic cross-sectional view of a transistor die unit cell in accordance with various embodiments of the present disclosure, where the cross-section is taken along line B-B' of FIG. 2A. Hereinafter, embodiments will be described with reference to examples including RF transistor dies and RF transistor amplifier packages, but it will be understood that embodiments of the present invention are not limited to RF devices.

As shown in FIGS. 2A-2B, the RF transistor die 210 is illustrated by way of example as a Group III nitride-based HEMT RF transistor amplifier that has a plurality of unit cell transistors 116, where each unit cell transistor 116 includes a gate finger 152, a drain finger 154 and a source finger 156. It will be appreciated, however, that the RF transistor dies 210 may be implemented in a different technology such as, for example, a silicon LDMOS RF transistor amplifier. The gate fingers 152 are electrically connected to a common gate bus 146, and the drain fingers 154 are electrically connected to a common drain bus 148. The gate bus 146 is electrically connected to the gate terminal (e.g., through conductive vias 162 that extend from the gate bus 146), which may be implemented as an input contact pad 362 (see FIG. 6A) or conductive pillar 222 (see FIG. 6C), and the drain bus 148 is electrically connected to the drain terminal (e.g., through conductive vias 164 that extend from the drain bus 148), which may be implemented as an output contact pad 364 (see FIG. 6A) or conductive pillar 224 (see FIG. 6C). The source fingers 156 are electrically connected to the source terminal 126 (e.g., through conductive vias 166), which may be implemented by as a ground contact pad 366 (see FIG. 6A) or conductive pillar 226 (see FIG. 6C). The conductive vias 162, 164, 166 may be metal-plated vias that extend through the semiconductor structure 130.

In some embodiments, portions of a patterned backside metal layer 126 may provide one or more of the input 362, the output 364, and the ground 366 terminals (see FIG. 6A) on the bottom surface of the transistor die 210. In other embodiments, one or more conductive pillar structures may provide input 222, output 224, and ground 226 terminals (see FIG. 6C) that protrude from a top surface of the transistor die 210.

It will be appreciated that FIGS. 2A-2B (and various of the other figures) are highly simplified diagrams and that actual RF transistor dies may include many more unit cells and various circuitry and elements that are not shown in the simplified figures herein. More generally, the figures herein are intended to represent structures for identification and description and are not intended to represent the structures to physical scale.

Some embodiments of the present disclosure may arise from difficulties that may be presented by existing RF power device package configurations, such as mechanical issues with mounting the package to a RF circuit board and/or inter-component spacing. For example, manufacturing variations in the thickness of the flange 176 and/or package PCB 177 may lead to mechanical problems, including misalignment between the top cladding 183 of the RF circuit board 180 and the contact leads 172, 174 of the package 170. As such, it may be difficult to achieve simultaneous contact between the bottom of the flange 176 and the heat sink 186 at the bottom of the opening 181 in the RF circuit board 180, and between the top cladding 183 of the RF circuit board 180 and the package input/output leads 172/174. Also, component attachment using some conventional epoxy-based attachment techniques may require relatively large inter-component spacing to prevent undesired electrical contact between components, which may impose limitations on package size and/or wire bond lengths.

Embodiments of the present disclosure provide packaged RF power devices (also referred to herein as RF transistor amplifier packages) including a transistor die and/or discrete passive components that attached to a substrate by solder material or paste, e.g., using solder mask/solder/solder reflow methods, instead of epoxy- or solder bump-based attachment. In contrast, components of conventional RF transistor amplifier packages may be typically attached to a metal flange using epoxy, silver (Ag) sinter, pre-attached gold-tin (AuSn) backside metal, etc.

The transistor dies may include wide bandgap semiconductor-based structures (e.g., GaN and/or SiC), for example, a GaN HEMT, or silicon-based semiconductor structures, for example, a silicon-based LDMOS transistor. The discrete passive components (e.g. capacitors, spiral inductors, transmission lines, etc.) may include integrated passive devices (IPDs) and/or surface mount devices (SMDs), for example, wide bandgap semiconductor-based components (such as SiC components on SiC substrates) or other components including a semiconductor body with respective conductive terminals configured for surface mount attachment.

The substrate to which the transistor die(s) are attached may be a structure including one or more electrically insulating members with conductive layers defining patterns, traces, routing, and/or leads thereon (such as a PCB), which are exposed by a patterned solder mask on a surface of the substrate. The substrate may be included in the RF transistor amplifier package (also referred to herein as a package substrate), or may be external to the RF transistor amplifier package (e.g., a customer PCB). The transistor die is electrically connected to the conductive patterns of the substrate by a solder material, and is aligned by the patterned solder mask. The conductive top cladding or other conductive layers of the package substrate may define respective conductive leads (e.g., input and output leads) that are configured to provide RF signal connections to the transistor die, also referred to herein as RF leads, extending along (and in some embodiments, coplanar with) the same surface to which the transistor die(s) are attached. The conductive leads are free of electrical connections that extend substantially beyond edges of the package substrate (the electrically insulating layer(s) thereof).

In some embodiments, the transistor die and/or passive components may have patterned bottom side metallization (also referred to as a patterned backside metal layer). For example, in a transistor die, the gate, source, and/or drain terminals may be routed to the bottom surface of the transistor die by conductive vias. The backside gate and drain terminals may be isolated or separated from the source/ground terminal by separation gaps in the backside metal layer. In other embodiments, the transistor die may include conductive pillar connections (also referred to herein as conductive pillars) protruding from a top surface of the transistor die (adjacent the transistor active region), which may be coupled to the gate, source, and/or drain terminals.

Transistor die and/or passive component attach using solder/solder mask/solder reflow methods according to embodiments of the present disclosure may provide smaller inter-component spacing by way of greater placement accuracy with less variation than some conventional attachment methods (e.g., epoxy-based (or other dispensed attach material), which can require a large dispense nozzle (and therefore larger dispense area and larger components and separation gaps therebetween). The solder material can be applied using a screen printing and stencil method onto a large panel including multiple package substrates (e.g., PCB array), and several wide bandgap semiconductor components may be placed and reflowed at the same time. That is, multiple components may be attached in parallel (i.e., "in batch"), rather than having to sequentially dispense epoxy for each component attach, thereby reducing assembly time and cost.

The self-aligning nature of solder reflow methods, when combined with appropriately designed solder mask patterns on the substrate, may allow for more accurate die attach placement and smaller placement tolerances. That is, when the solder material is reflowed, the components to be attached can self-align, correct for rotations and twists, etc., and re-locate themselves to the center of the boundary defined by the solder mask patterns or conductive patterns/metallization exposed by the solder mask patterns. Additionally, smaller components can be attached more precisely (compared to epoxy), and separation between components can have smaller requirements (e.g., less than about 0.25 mm (10 mils), or about 0.25 mm to about 0.1 mm (4 mils), or less than about 0.1 mm, for example, about 0.1 mm to about 0.05 mm). In contrast, component spacing for epoxy attachment may typically be greater than about 10 mils, to ensure that adjacent components are sufficiently spaced to avoid electrical shorting.

In addition, the lower temperature profile of solder reflow (less than or equal to about 260° C.), may be gentler on the components of the package, improving reliability, ruggedness, and assembly cost of the attach as compared to epoxy attach (which may require curing temperatures as high as 400° C.). Moreover, the input, output, and ground terminals may be provided on the same side of the transistor die (as compared to epoxy attachment, which typically requires sufficient terminal spacing to avoid electrical shorting between terminals by the epoxy). Parasitic inductance and losses from interconnecting or stitching wire bonds may thus be eliminated, as multiple transistor leads can be connected directly to a substrate (free of wire bond connections), with routing layers and/or passive components on the substrate providing pre-matching and/or filtering circuits.

The packaged RF power device can be placed into an external RF circuit board (e.g., a customer PCB). For example, the package input/output leads may be confined within or may not extend substantially beyond edges of the package substrate, and the RF transistor amplifier package may be sized or otherwise configured such that the package substrate can be placed into an opening in an RF circuit board. In some embodiments, the top surface (e.g., the conductive top cladding layer) of the package substrate may be substantially coplanar or "flush" with the surface (e.g., a conductive top cladding layer) of the RF circuit board outside the opening. That is, the respective leads of the RF transistor amplifier package may be substantially coplanar with (i) the surface of the package to which the transistor die(s) are attached, and/or (ii) the conductive traces/routing on the surface of the external RF circuit board. As such, electrically conductive (e.g., copper) shims and/or SMDs/IPDs may be used to bridge the gap from the RF transistor amplifier package to the RF circuit board to provide electrical connection therebetween.

In some embodiments, the transistor die (with patterned backside metal layer or frontside conductive pillar structures) and/or other discrete passive surface mountable components (e.g., SMDs and/or IPDs, which may provide matching and/or harmonic termination circuits) may be solder attached directly to the external RF circuit board, thus eliminating the need for a package housing. By exposing the passive surface mountable components at the top surface (similar to the components on a RF circuit board), embodiments of the present disclosure provide package configurations in which the components of the matching circuits can be changed (or fine-tuned) even after the package assembly is completed. That is, in embodiments of the present disclosure, the RF transistor amplifier package can be modified or tuned for different frequency bands (e.g., in virtual broad-band applications) after assembly and/or shipment to customers.

The transistor die and other passive components can be protected by applying an environmental scratch coat layer or other conformal (e.g., spray-on) protective layer after the solder attach to substrate. Examples of such conformal protective layers may include, but are not limited to, polyimide, benzocyclobutene (BCB), polyolefin resin, siloxane, or eruamide. Embodiments of the present disclosure may also provide packaged RF power devices with lower thermal resistance, as the package substrate can be placed directly on the heat-sink (or heat-sink metallization) of the external RF circuit board, without intervening vias or copper slats needed to reach the heat-sink metallization.

Embodiments are described below with reference to example RF transistor amplifier packages 370, 470 or components 570 and variations thereof. The transistor amplifier packages 370, 470 or components 570 may each include at least one transistor die 210 (which may include variations 210-1, 210-2 described herein) having a semiconductor structure 130 that is attached and electrically connected to conductive patterns 373 at a surface of a substrate 375, 387 by a solder material 340. In particular, respective gate 362, source 366, and/or drain 364 terminals of the transistor die(s) 210 are attached and electrically connected to respective ones of the conductive patterns 373 exposed by solder mask patterns 330 at the surface of a substrate 375, 387 by the solder material 340, and are aligned by the solder mask patterns 330. One or more surface mountable passive electrical components 378i, 378o (generally, 378) may likewise be attached to the surface of the substrate 375, 387 by the solder material 340 and aligned by the solder mask patterns 330, such that respective terminals thereof are electrically connected to respective ones of the conductive patterns 373. The passive electrical components 378 may include discrete surface-mountable capacitors, inductors, resistors, or other interconnect structures, including IPDs, and may implement portions of input, inter-stage, or output impedance matching circuits or harmonic termination circuits for the RF transistor amplifiers 370, 470, 570. The substrate may be a substrate 375 included in a packaged RF transistor amplifier 370, 470 (referred to herein as a package substrate 375), or may be a substrate 387 included in an external RF circuit board 300, 400 (e.g., a customer PCB).

Figure 6A:
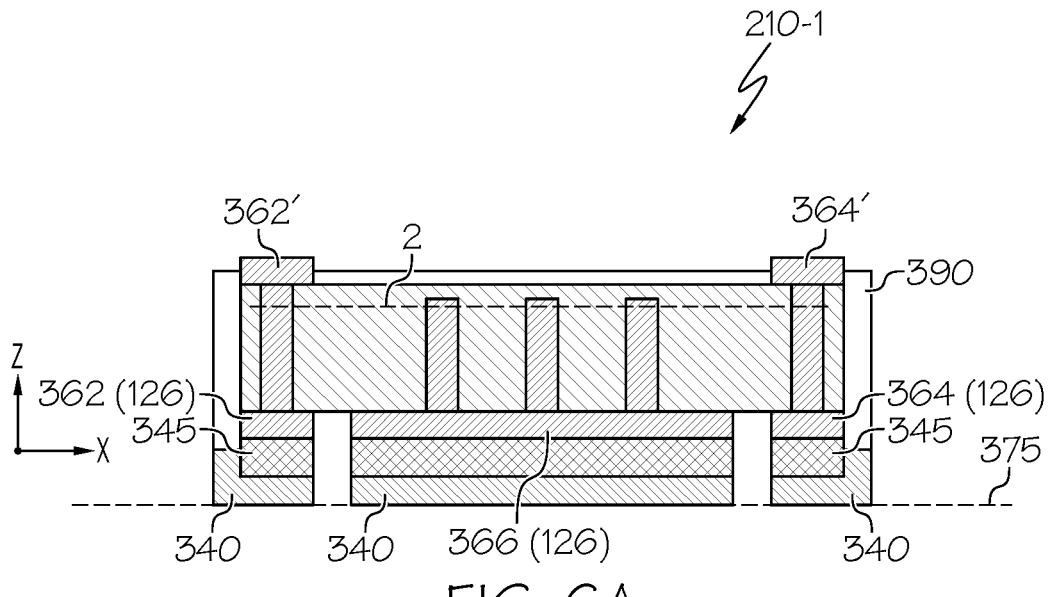
FIG. 6A is a schematic side view of a backside mountable RF transistor die in accordance with various embodiments of the present disclosure, respectively.

In some RF transistor amplifier packages 370, 470 or components 570 described herein, the transistor die(s) 210 may include a patterned backside metal layer 126 on a bottom surface thereof, as shown for example by the transistor die 210-1 in FIG. 6A. The patterned backside metal layer 126 may provide input (e.g., gate 362), output (e.g., drain 364), and/or ground (e.g., source 366) terminals for respective transistor die(s) 210. The transistor die(s) 210 may be mounted backside-down with the patterned backside metal layer 126 attached to the surface of the substrate 375, 387 by the solder material 340 (and aligned by the solder mask patterns 330 in a desired position on the surface) such that respective gate 362, source 366, and/or drain 364 terminals of the transistor die(s) 210 are electrically connected to respective ones of the conductive patterns 373. A barrier metal layer 345 may be provided between the patterned backside metal layer 126 and the solder material 340 on the surface of the substrate 375, 387, and may be a material (e.g., nickel (Ni), titanium (Ti), and/or alloys thereof) configured to prevent migration of metal particles from the solder material 340 into the backside metal layer 126 (e.g., gold (Au)).

Figure 6B:
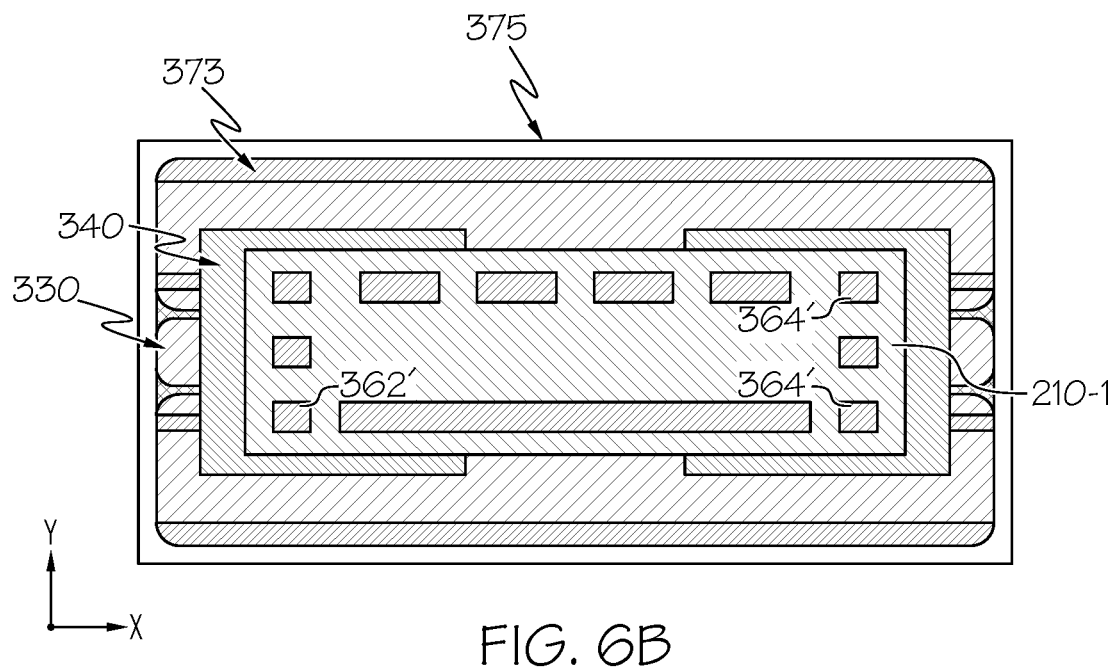
FIG. 6B is a plan view of the RF transistor die of FIG. 6A mounted on a PCB.
Figure 6C:
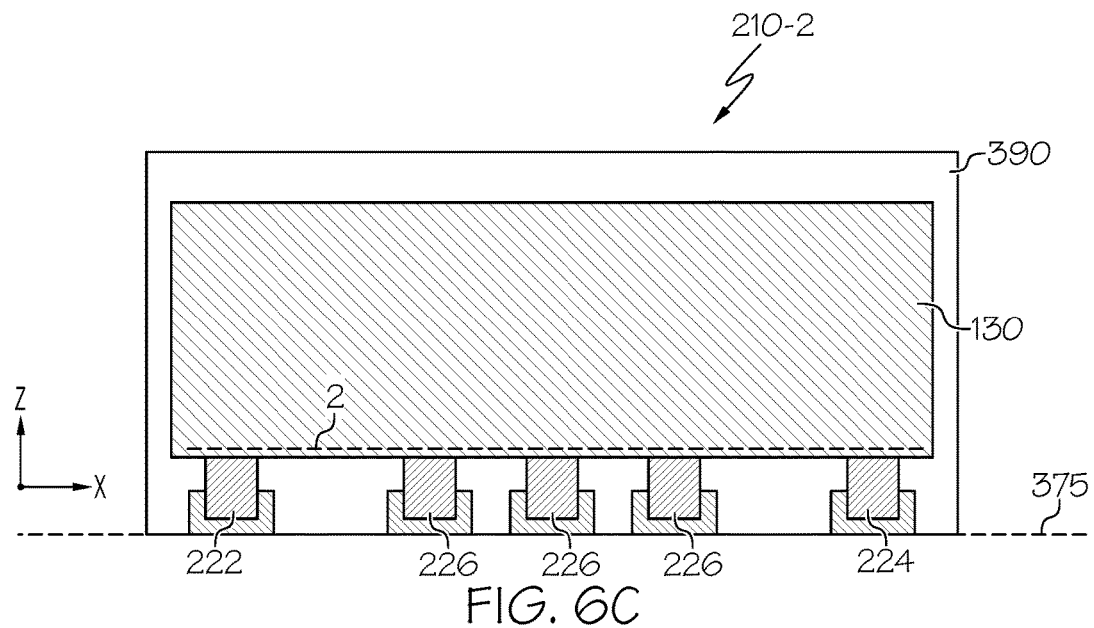
FIG. 6C is a schematic side view of a flip chip mountable RF transistor die in accordance with various embodiments of the present disclosure.

In some RF transistor amplifier packages 370, 470 or components 570 described herein, the transistor die(s) 210 may include a plurality of conductive pillars 222, 224, 226 on a top surface (adjacent the transistor active area 2) thereof, as shown for example in the transistor die 210-2 in FIG. 6C. The conductive pillars 222, 224, 226 may be coupled to input (e.g., gate 310), output (e.g., drain 305), and/or ground (e.g., source 315) terminals for respective transistors 10. The transistor die(s) 210 may be mounted frontside- or face-down with the conductive pillars 222, 224, 226 attached to the surface of the substrate 375, 387 by the solder material 340 (and aligned by the solder mask patterns 330 in a desired position on the surface) such that respective gate 222, source 226, and/or drain 224 terminals of the transistor die(s) 210 are electrically connected to respective ones of the conductive patterns 373. That is, the conductive-pillar-based interconnects 222, 224, 226 may allow for "flip-chip" die configurations, in which pads or terminals of the transistor die(s) 210 are implemented on an upper surface or top side of the transistor die 210 (i.e., adjacent the transistor active region 2) and the die 210 is configured to be mounted on a substrate 375, 387 face-down and electrically connected to the conductive patterns 373.

In any of the frontside or backside mounting configurations as described herein, the transistor die(s) 210 are attached by a solder material 340 to the conductive patterns 373 exposed by solder mask patterns or strips 330 at a surface of a substrate 375, 387, using solder/solder mask/solder reflow methods in a manner similar to that used with other discrete surface mountable components, such as SMDs or IPDs. The self-aligning feature of solder-reflow attach methods allow for tighter placement tolerances of the transistor dies(s) 210 and passive electrical components 378 on the surface of the substrate 375, 387. For example, the passive electrical components 378 and/or the transistor die(s) 210 may be aligned by the solder mask patterns 330 and spaced apart from one another by respective gaps D1, D2 of less than about 0.25 mm (10 mils), for example, less than about 0.1 mm (4 mils) or about 0.1 mm to about 0.05 mm, which may be significantly smaller than inter-component spacings achievable with some existing epoxy-based or conductive bump-based techniques. In some embodiments, no wire bonds are used to electrically connect the terminals 362, 364, and/or 366 of the transistor die(s) 210 to the package substrate 375 or the external RF circuit board substrate 387. Embodiments of the present invention may thereby increase component density and placement accuracy and reduce costs and time associated with package assembly.

FIG. 3A is a schematic side view of an RF power amplifier package 370 including surface mounted active components 210 and passive components 378 in accordance with various embodiments of the present disclosure. FIG. 4A is a schematic side view of an RF power amplifier package 470 including surface mounted active components 210 and passive components 378 in accordance with further embodiments of the present disclosure.

As shown in FIGS. 3A and 4A, the packages 370, 470 respectively include one or more transistor dies (e.g., a GaN on SiC transistor die) 210 and/or one or more passive components 378i, 378o (collectively 378). The transistor die(s) 210 and passive components 378 are attached to conductive patterns 373 at a surface of a package substrate 375 by a solder material 340, and aligned by solder mask patterns 330. The transistor die(s) 210 each include input, output, and ground terminals, shown as gate 362, drain 364, and source 366 terminals, respectively. In the examples of FIGS. 3A and 4A, the terminals 362 and 364 are provided on the front or top surface of the die(s) 210, while the terminal 366 is provided on the back or bottom surface of the die(s). However, it will be understood that the terminals 362, 364, and 366 may be routed to the top or bottom (or both) surfaces of the die(s) 210 in various combinations, e.g., as defined by respective portions of a patterned backside metal layer 126 shown in FIG. 6A, or as coupled to respective conductive pillars 222, 224, 226 shown in FIG. 6C. The transistor die(s) 210 may define a single-stage amplifier or a multi-stage amplifier (such as a Doherty amplifier) in some embodiments.

The package substrate 375 may be any substrate or laminate (e.g., a PCB) including an electrically insulating member 377 and one or more electrically conductive patterns 373 defined by portions of conductive layers (e.g., copper cladding layers or other metallization) that are exposed by the solder mask patterns 330. While illustrated as including two conductive layers (conductive top cladding and conductive bottom cladding) on an electrically insulating member 377, the package substrate 375 can include fewer or more layers (e.g., a multi-layer circuit board including, for example, 5 layers, 8 layers, etc.) with conductive vias connecting different conductive layers. The number of layers on the package substrate 375 can be different from number of layers on an external (e.g., customer) RF circuit board (denoted as 300, 400 herein). In some embodiments, the package substrate 375 may include embedded capacitance layers, with the conductive patterns 373 on the surface providing electrical connections thereto.

The transistor die 210 and passive components 378 are reflow soldered on the top surface of the package substrate 375. The solder material 340 may be a solder paste including metal (e.g., tin (Sn)) solder particles suspended in a thick fluid medium or flux. The solder mask patterns 330 may be a thin polymer layer that is patterned to expose portions of the conductive patterns 373 for electrical connection, while covering other portions of the conductive patterns 373 for electrical isolation and protection against oxidation. The solder mask patterns or strips 330 are used to guide the locations of the solder 340 on the top surface of the package substrate 375.

The conductive patterns 373 may define input and output leads 372 and 374 of the package 370. The input and output leads 372 and 374 are respective RF leads that provide RF signal connections to the respective terminals 362 and 364 of the transistor die(s) 210. The RF leads 372, 374, may include, for example, microstrip transmission lines, and may extend along or may otherwise be substantially coplanar with the same surface to which the transistor die(s) 210 are attached. The ground terminal of the transistor die(s) 210 (e.g., source terminal 366 in FIG. 6A, conductive pillars 226 in FIG. 6C) is attached to a conductive member or array 380 by the solder material 340. The conductive member 380 may be embedded in or may otherwise extend through the package substrate 375 to provide an electrical and/or thermal conduction path from the transistor die(s) 210. For example, the conductive member 380 may be an embedded copper member, copper slats, or dense/filled copper via array that extends through the package substrate 375 to provide an electrical ground and a thermal heatsink for the transistor die(s) 210.

In the example package 370 of FIG. 3A, the bottom surface of the package substrate 375 is mounted on a thermally conductive package submount or metal flange 376. For example, the flange 376 may be a CPC (copper, copper-molybdenum, copper laminate structure) or copper flange that provides a heat dissipation path or structure for the package 370. The package substrate 375 may not extend substantially beyond edges of the thermally conductive package submount 376 in some embodiments. The embedded conductive member 380 may electrically and thermally couple the ground terminal 366 of the transistor die(s) to the flange 376, which may be configured to be placed on a heatsink/ground of an external RF circuit board (e.g., the heatsink 386 of the RF circuit board 300 shown in FIG. 3B).

In contrast, the example package 470 of FIG. 4A does not include a thermally conductive package submount 376 on bottom surface of the package substrate 375. Rather, the embedded conductive member 380 is exposed at the bottom surface of the package substrate 375, such that the package substrate 375 can be placed directly on a heatsink/ground of an external RF circuit board (e.g., the heatsink 486 of the RF circuit board 400 shown in FIG. 4B).

In FIGS. 3A and 4A, the transistor die(s) 210 are attached by the solder material 340 and aligned by the solder mask patterns 330 on a surface of the package substrate 375, rather than being attached directly to a conductive submount or flange 376. That is, the package substrate 375 does not include an opening therein that exposes a submount 376, but rather, provides a substantially planar or continuous surface to which the transistor die(s) 210 and/or other passive components 378 are attached by the solder material 340. High power RF transistor die(s) 210 can generate significant amounts of heat, which should be effectively conducted to the thermal submount 376 in order to maintain good RF performance. This may effectively be achieved by the embedded conductive member 380 (which may include, for example, copper slats or embedded copper coin), thus providing a lower thermal resistance relative to, e.g., sparse via array.

The transistor die(s) 210 and/or other passive components 378 may be protected with environmental scratch coat (e.g., a spray-on coating) or other environmental protection layer 390 (see FIGS. 6A and 6C). The environmental protection layer 390 may conformally extend on one or more surfaces of the die(s) 210, the passive components 378, and/or the surface of the package substrate 375 therebetween. The environmental protection layer 390 may be a polyimide or benzocyclobutene (BCB) layer or coating, and may have a thickness of about 3 μm to about 10 μm in some embodiments, for example, about 5 μm to about 7 μm. As such, the packages 370, 470 may be free of an overmold or lid member covering the transistor die(s) 210. In addition, the environmental protection layer 390 may be of an optically dark or opaque material that is configured to reduce or block light penetration to the transistor die and prevent unwanted influence of the transistor performance by light, such as has been known to happen with group III nitride devices.

FIG. 3B is a schematic side view of the RF power amplifier package 370 mounted on an external RF circuit board 300 (e.g., a customer PCB) with electrically conductive shims 385 used for package-board electrical connections in accordance with various embodiments of the present disclosure. FIG. 4B is a schematic side view of an RF power amplifier package 470 mounted on an external RF circuit board 400 (e.g., a customer PCB) with electrically conductive shims 385 used for package-board connections in accordance with further embodiments of the present disclosure.

As shown in FIGS. 3B and 4B, the RF circuit board 300, 400 respectively include a substrate 387 (e.g., a PCB) having one or more conductive layers that define conductive patterns 373. The substrate 387 is attached on a top surface of a thermally conductive substrate or heat sink 386, 486 (e.g., a copper or aluminum block or base structure). One or more passive components 378' may be electrically connected to the conductive patterns 373, for example, to implement portions of impedance matching or harmonic termination networks. The substrate 387 includes an opening 381, 481 that exposes a surface of the heat sink 386, 486. The opening 381, 481 is sized to accept the RF amplifier package 370, 470 such that the package 370, 470 can be mounted on the heat sink 386, 486. The heat sink 386, 486 provides a thermal path to conduct heat away from the transistor die(s). The heat sink 386, 486 also serves as an electrical ground for the RF signals traveling through the RF circuit board 300, 400.

In the example of FIG. 3B, the opening 381 exposes a recessed portion R of the heat sink 386. The recess R may be machined into the heat sink 386 such that, after placement of the packaged RF device 370 onto the RF circuit board 300, the package submount 376 and the package substrate 375 are confined within the opening 381. For example, the recess R may have a depth corresponding to a combined thickness of the package substrate 375 and the package submount 376, such that, when placed in the opening 381, the top surface of the package substrate 375 may be substantially coplanar with a top surface of the PCB 387 outside the opening 381. The opening 381 may also have dimensions sized to accept the packaged device 370 with some clearance or gap (e.g., less than about 15 mils, for example, about 10 mils or less, or about 5 mils or less) between the sidewalls of the opening 381 and the periphery or edges of the packaged device 370. In some instances, it may be desirable to justify the packaged device 370 to the left or to the right of the center of the opening 381 (e.g., to be flush or in contact with the PCB 387 on one side), with a gap on the other side of about 30 mils or less (e.g., about 15 mils or less, or about 10 mils or less) between the periphery or edges of the packaged device 370 and the input lead 372 or the output lead. In other instances, the packaged device 370 may be substantially centered in the opening 381, for example, with respective gaps of about 15 mils or less (e.g., about 10 mils or less, or about 5 mils or less) on either side (e.g., at the input side and the output side, for connection to the input lead 372 and the output lead 374, respectively).

In the example of FIG. 4B, the package substrate 375 may have a same or substantially similar thickness as the PCB 387 of the external RF circuit board 400, such that the heatsink 486 of the RF circuit board 400 may provide a substantially planar or continuous surface (i.e., without a recess R therein) including the bottom surface of the package substrate 375 and the bottom surface of the PCB 387 thereon. That is, the heatsink 486 may have a continuous surface with a substantially uniform thickness throughout, free of any recesses, dips, or embedded conductors (e.g., copper coins) therein. As such, the package 470 can be placed on the RF circuit board 300 directly on the substantially planar surface of the heatsink 486 with consistent positioning in the vertical dimension and less performance variation as signal flows from packaged device to customer circuit board, which may simplify assembly and manufacturing of an RF amplifier including the RF circuit board 400 and the package 470, and may improve the ground return-path of the RF signal flowing from the RF circuit board 400 to the package 470.

Accordingly, in FIGS. 3B and 4B, respective surfaces (e.g., conductive top cladding layers 373) of the package substrate 375 and the RF circuit board 300, 400 may be substantially coplanar (or "flush") with one another. For example, the upper or top surface of the package substrate 375 may be within about 15 mils (e.g., within about 10 mils, within about 7 mils, within about 5 mils, or less) above or below the top surface of the RF circuit board 300, 400 or PCB 387. Conductive surface mount components 385 are used to bridge the connection between the RF circuit board 300, 400 and the conductive leads 372, 374 of the packaged device 370, 470. For example, the conductive surface mount components may be implemented by discrete conductive shims 385 (e.g., copper shims) or other flexible conductive materials. In some embodiments the conductive shims 385 may be implemented by copper tape, which may have sufficient flexibility to provide a conductive bridge between the conductive patterns 373 on the top surface of the RF circuit board 300, 400 and the conductive patterns 373 on the top surface of the package substrate 375 providing the leads 372, 374 of the packaged RF power device 370, 470, with as much as about ±15 mils (e.g., about ±10 mils, about ±7 mils, or about ±5 mils) of deflection between substantially coplanar surfaces of the substrates 375 and 387.

In some embodiments, the conductive surface mount components used for package-board connections can be implemented by additional passive surface mount components 378. For example, in addition or alternatively to flexible conductive shims 385, other surface mount components 378 (e.g., discrete capacitors, inductors, resistors, or other interconnect structures, including IPDs) can be used to provide a conductive bridge between the conductive patterns 373 of the RF circuit board 300, 400 and the conductive patterns 373 providing the leads 372, 374 of the packaged RF power device 370, 470.

As such, the RF signal connections between the package 370, 470 and the RF circuit board 300, 400 are implemented by conductive (e.g., copper) shims 385 or SMD components 378 (e.g., RF capacitors, zero-ohm resistors, etc.) that extend substantially beyond the edges or periphery of the package substrate 375, and may be added after assembly and/or sale. Since the conductive shims 385 are flexible, RF transistor amplifier packages 370, 470 according to embodiments of the present disclosure may be more tolerant to misalignment (e.g., non-coplanarity) between the top surfaces 373 of the RF circuit board 300, 400 and the package 370, 470. That is, the flexible conductive shims 385 can bend to absorb misalignment between the respective surfaces 373 of the RF circuit board 300, 400 and the package 370, 470 while still maintaining electrical contact for RF signal connections.

FIG. 5A is a schematic side view of components 570 (including active components 210 and passive components 378i, 378o) of an RF power amplifier in accordance with various embodiments of the present disclosure. FIG. 5B is a schematic side view of the components 570 of FIG. 5A mounted on an external (e.g., customer) RF circuit board 500 in accordance with various embodiments of the present disclosure.

As shown in FIG. 5A, the RF power amplifier components 570 include one or more transistor dies 210 and one or more surface mount passive components 378i, 378o (collectively 378). In some embodiments, the passive component(s) 378o coupled to the output lead 374 may be a SiC or other wide bandgap semiconductor IPD or SMD, which may be configured to handle power and/or thermal requirements at the output of the transistor die(s) 210 (for which ceramic SMDs may not be sufficient). The passive component(s) 378i coupled to the input lead 372 of the transistor die(s) 210 may include ceramic or SiC SMDs or IPDs. The transistor die(s) 210 and passive components 378 may be similar or identical to those described above with reference to the packages 370, 470 of FIGS. 3A and 4A. An RF amplifier can be implemented by attaching the respective terminals of the components 570 to a surface of a substrate 387 of an external RF circuit board 500, free of an intervening package substrate 375. While illustrated in FIG. 5A as including components 570 with bottom-side terminals (e.g. the gate 362, drain 364, and source 366 terminals on the bottom surface of the die 210), it will be understood that one or more of the components 570 may have top-side terminals (e.g., implemented by conductive pillars 222, 224, 226 on the die 210 protruding from a top surface of the die 210) and may be attached to the surface of the substrate 387 in a flip chip configuration.

As shown in FIG. 5B, the RF circuit board 500 includes a substrate 387 (e.g., a PCB) having one or more conductive layers defining conductive patterns 373. The substrate 387 is attached on top surface of a thermally conductive substrate or heat sink 486 (e.g., a copper or aluminum block or base structure). The substrate 387 does not include an opening therein that exposes the top surface of the heat sink 486; rather, the heat sink 486 may provide a substantially planar top surface, with the bottom surface of the substrate 387 thereon. The conductive patterns 373 may include an embedded conductive member 380 (e.g., an embedded copper member, copper slats, or dense/filled copper via array) that extends through the package substrate 375 to provide an electrical ground and a thermal heatsink for the transistor die(s) 210. The transistor die(s) 210 and passive components may be re-flow soldered onto a top surface of the substrate 387 of the external RF circuit board 500, such that respective terminals of the components 570 are attached and electrically connected to respective ones of the conductive patterns 373 exposed by solder mask patterns 330 at the surface of the substrate 387 (in particular, with the terminal 366 of the die 210 attached and electrically connected to the embedded conductive member 380). The solder mask patterns or strips 330 are used to guide the location of the solder material 340 and thus align the components 570.

That is, the substrate 387 of the external RF circuit board 500 also provides the substrate for attachment of the RF transistor amplifier components 570. As such, there may be no transition or discontinuity (in lateral or vertical directions) between a customer circuit board 500 and an RF amplifier package substrate. The RF transistor amplifier components 570 are thus integrated on the external RF circuit board 500 as a continuous piece, which may reduce interconnect parasitics, and reduce performance variation. For example, the RF circuit board 500 may be manufactured by a customer, and the RF transistor amplifier supplier may supply the transistor die(s) 210 and the discrete surface mount passive components 378, which can be reflow soldered onto the external RF circuit board 500 at the same time as other surface mount passive components 378'. Such a configuration may provide additional flexibility and/or may reduce costs (assembly cost, package cost etc.) to the supplier.

The examples of FIGS. 3A to 5B thus illustrate packages 370, 470, and components 570 that are configured to be attached and electrically connected to an external RF circuit board 300, 400, 500 by a solder material 340, which may allow for RF amplifier implementations that are free of wire bonds, with the conductive patterns 373 providing routing between the RF input terminal 372, the transistor die(s) 210, and the RF output terminal 374. Passive components on the substrate 375, 387 may likewise implement pre-matching and/or filtering circuits free of wire bonds between components. Parasitic inductance and losses associated with wire bond connections between components may thus be eliminated.

FIG. 6A is an enlarged schematic side view of a backside mountable RF power transistor die 210-1 in accordance with various embodiments of the present disclosure, respectively. FIG. 6B is a plan view of the transistor die 210-1 of FIG. 6A mounted on a package substrate 375.

As shown in FIG. 6A, the transistor die 210-1 includes a semiconductor structure 130 having a backside metal layer 126 on a bottom surface thereof. The bottom surface of the semiconductor structure 130 is opposite the transistor active region 2, and may include semiconductor (e.g., SiC) substrate in some embodiments. The backside metal layer 126 may extend along the bottom surface, and may be patterned to provide the input (gate) 362, output (drain) 364, and ground (source) 366 terminals for the transistor die 210. Additional gate 362' and drain 364' terminals are shown on the top surface of the die 210 by way of example. A barrier metal layer 345 is provided between the terminals 362, 364, 366 defined by the patterned backside metal layer 126 and the solder material 340 on the surface of the substrate 375, 387. The barrier metal layer 345 is configured to reduce or prevent migration of metal particles (e.g. Sn) from the solder material 340 into the backside metal layer 126. For example, the backside metal layer 126 may include gold (Au), and the barrier metal layer 345 may include at least one of Ni, Ti, and/or alloys thereof. In some embodiments, the barrier metal layer 345 may have a thickness of less than about 2 micrometers (μm), for example, about 0.5 μm to about 1.5 μm.

As shown in FIG. 6B, the transistor die 210-1 is mounted backside-down on a surface of the package substrate 375. The package substrate 375 includes a solder mask pattern 330 thereon, which exposes conductive patterns 373 at the surface thereof. The gate 362, source 366, and drain 364 terminals of the transistor die 210-1 are attached and electrically connected to respective ones of the conductive patterns 373 by the solder material 340, with portions of the barrier metal layer 345 between the terminals 362, 364, 366 and the solder material 340. The solder mask patterns 330 and the self-aligning nature of the solder reflow process may align the input, output, and ground terminals of the die 210-1 with greater precision or accuracy than may be possible with epoxy- or conductive bump-based attachment. The input 362, output 364, and ground 366 terminals may all be provided on the same (back) side of the die 210-1. Solder-based attachment as described herein may thereby allow for connection of a die 210-1 with multiple terminals on a same (e.g., bottom) surface of the transistor die 210-1, which may not be possible with some conventional epoxy-based attachment techniques (which, due to the relatively greater volume of the epoxy material, or lack of surface adherence to metallic surfaces may electrically short adjacent terminals on the same surface of the transistor die).

FIG. 6C is a schematic side view of a flip chip mountable RF power amplifier die 210-2 in accordance with various embodiments of the present disclosure. As shown in FIG. 6C, the transistor die 210-2 includes a semiconductor structure 130 having a top surface adjacent the transistor active region 2, and a plurality of conductive pillars 222, 224 and 226 protruding from the top surface of the transistor die 210-2. The conductive pillars 222, 224, 226 provide input, output, and ground terminals, respectively, at the frontside of the transistor die 210-2 (adjacent the active region 2), and are configured to be attached and electrically connected to respective conductive patterns 373 on a surface of a substrate 375, 387 by a solder material 340. The conductive pillars 222, 224, 226 may be formed from a material (e.g., copper) that is less susceptible to migration of metal particles from the solder material 340, such that the solder material 340 may directly attach the conductive pillars 222, 224, 226 to the conductive patterns 373 on a surface of a substrate 375, 387 free of the barrier metal layer 345 therebetween.

In the embodiments shown in FIGS. 6A to 6C, an environmental protection layer 390 conformally extends on one or more surfaces of the transistor die 210-1, 210-2. The environmental protection layer 390 may be an environmental scratch coat layer or other conformal (e.g. spray-on) protective layer, such as polyimide, benzocyclobutene (BCB), polyolefin resin, siloxane, or eruamide, and may be applied after the solder attachment of the transistor dies 210-1, 210-2 to the substrate 375, 387. The environmental protection layer 390 may have a thickness of about 3 μm to about 10 μm, for example, about 5 μm to about 7 μm, on respective surfaces of the transistor dies 210-1, 210-2 in some embodiments.

Figure 7:
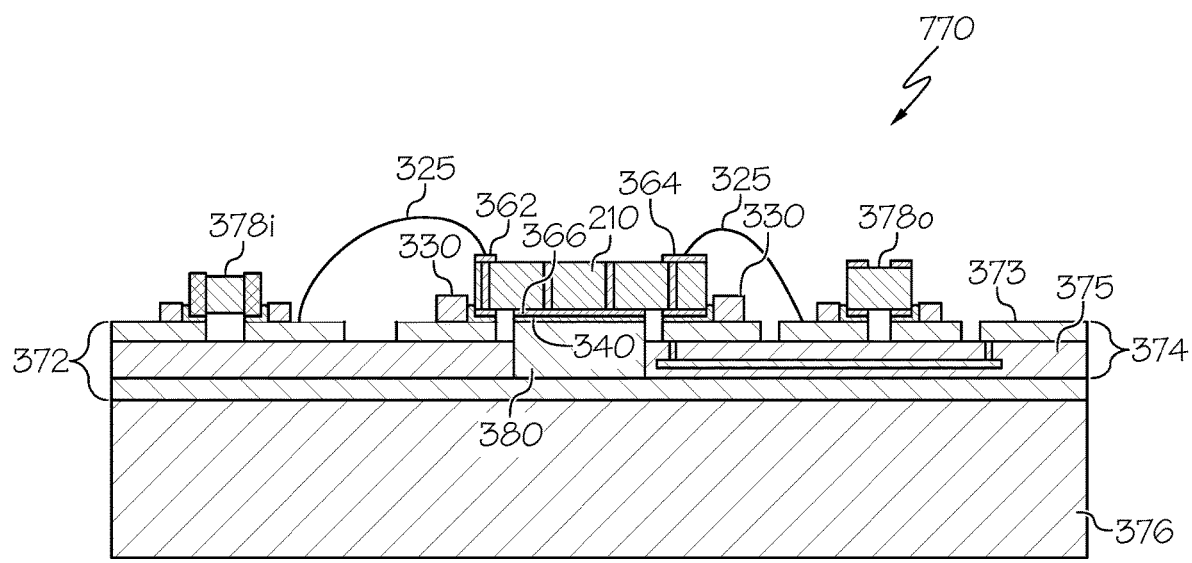
FIG. 7 is a schematic side view of a transistor amplifier package including wire bonds between active and passive components in accordance with various embodiments of the present disclosure.
Figure 8:
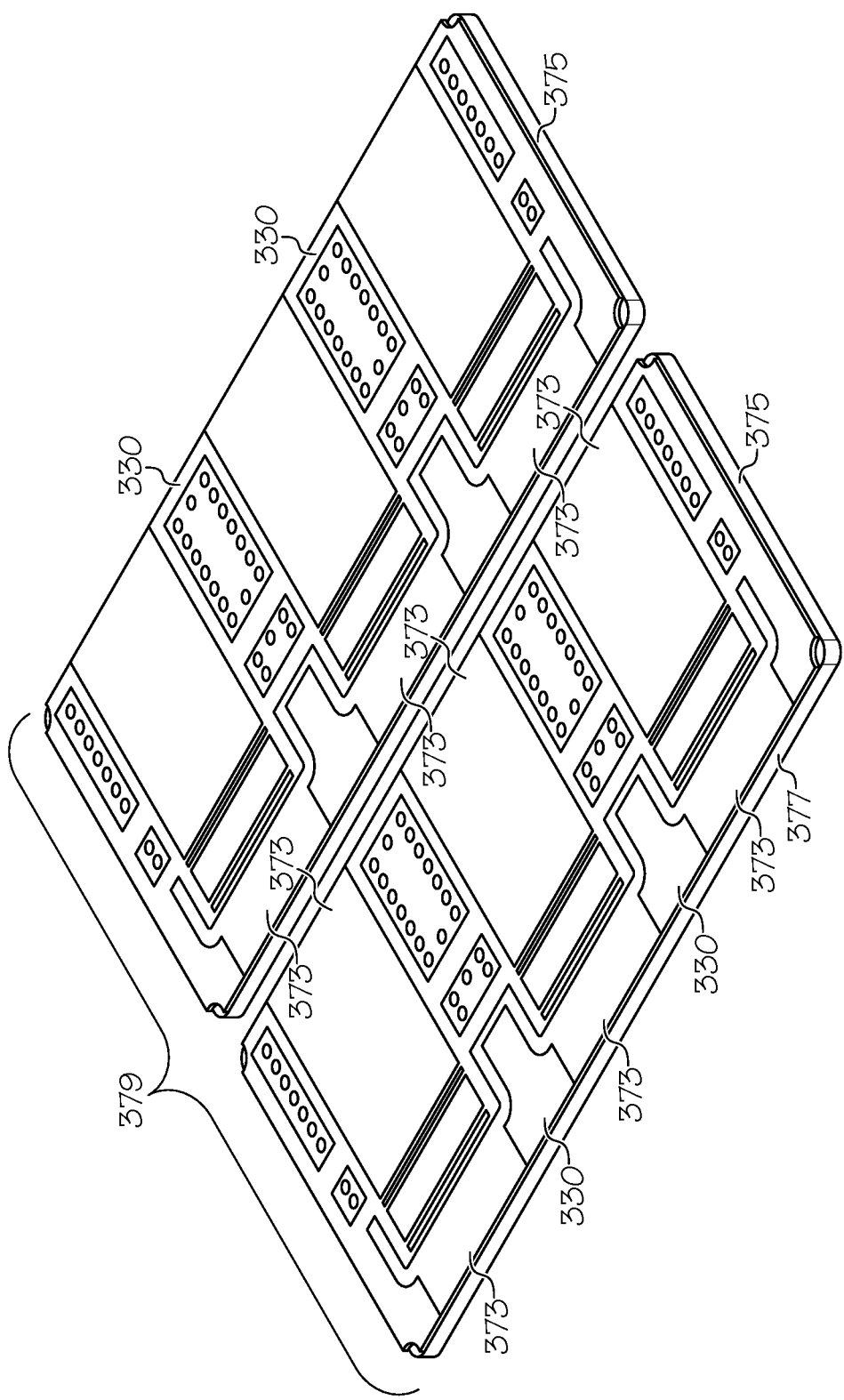
FIGS. 8, 9, and 10 are schematic views illustrating methods of fabricating a transistor amplifier package in accordance with various embodiments of the present disclosure.
Figure 9:
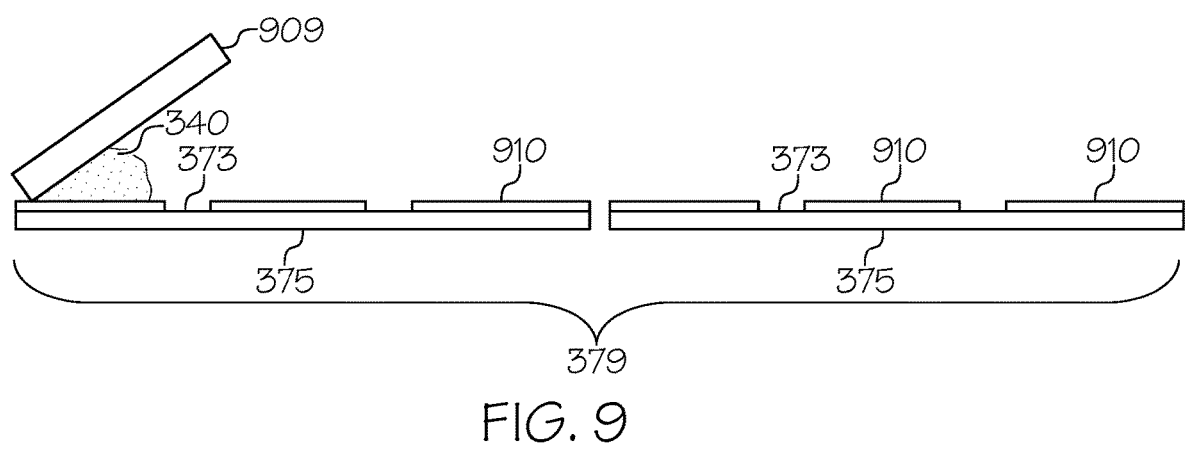
Figure 10:
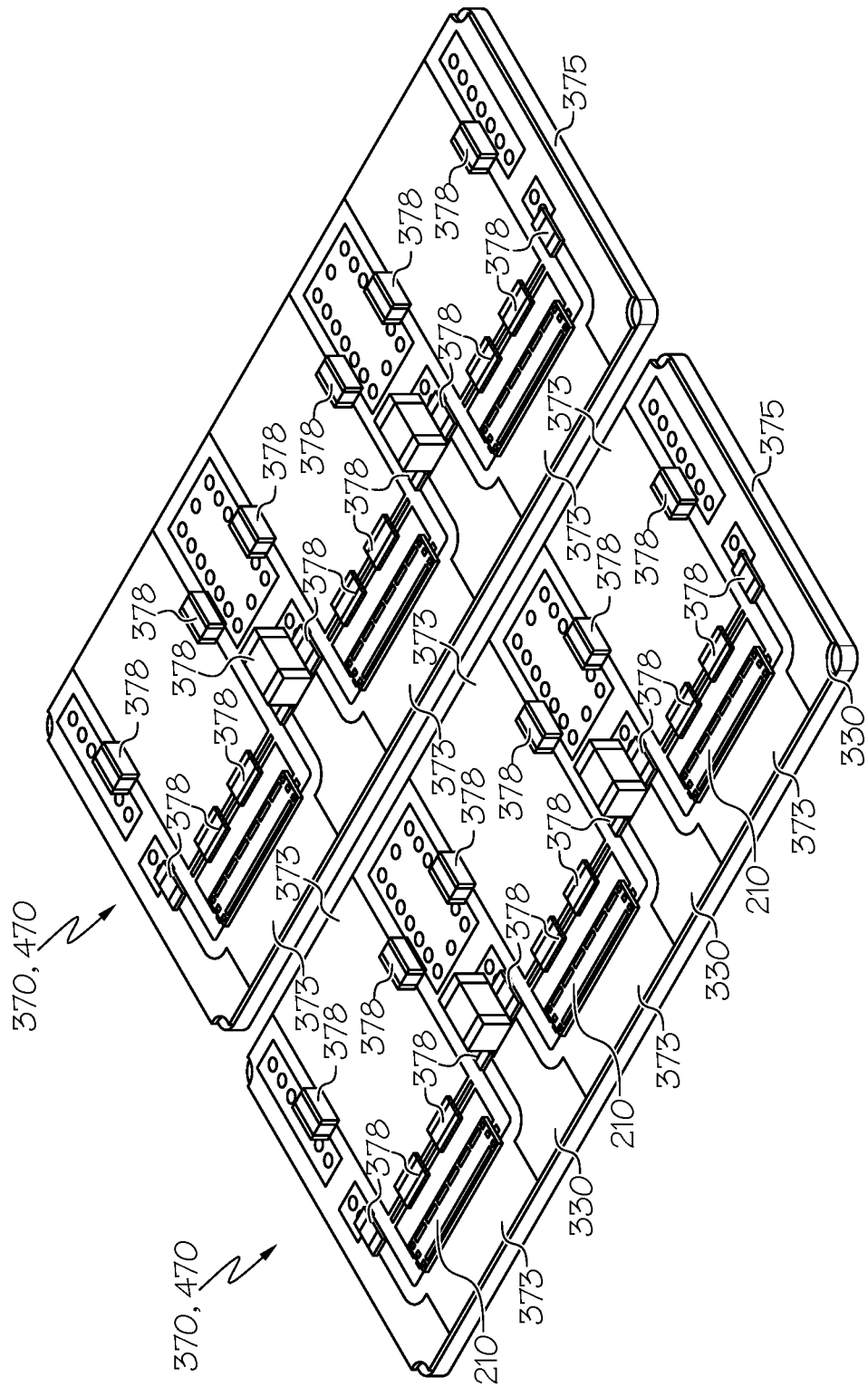

FIG. 7 is a schematic side view of an RF power amplifier package 770 including wire bonds between active components 210 and passive components 378i, 378o in accordance with various embodiments of the present disclosure. As shown in FIG. 7, the transistor die 210 includes a bottom surface including gate 362, drain 364, and source 366 terminals that are attached and electrically connected to respective conductive patterns 373 on the surface of a package substrate 375 by a solder material 340, and aligned by solder mask patterns 330 thereon. A top surface of the transistor die 210, opposite the bottom surface, includes additional gate 362' and drain 364' terminals. Wire bonds 325 are used to electrically connect the gate 362' and/or drain 364' terminals on the top surface to the passive electrical components 378i, 378o. The passive electrical components 378i, 378o may define portions of input, inter-stage, or output impedance matching circuits or harmonic termination circuits for the RF transistor amplifier package 770. As such, electrical connections to the terminals 362, 364, 366 of the transistor die 210 may be made from both the top and bottom surfaces, e.g., for further ease in implementation of impedance matching and/or harmonic termination circuits. Other elements of the package 770 of FIG. 7 may be similar or identical to the packages 370, 470 described herein FIGS. 8, 9, and 10 are schematic views illustrating methods of fabricating the RF power amplifier package 370, 470 in accordance with various embodiments of the present disclosure. As shown in the perspective view of FIG. 8, a plurality of package substrates 375. The package substrates 375 may be attached or otherwise mechanically connected to one another in a panel 379. The package substrates 375 each include an electrically insulating layer 377 and one or more conductive layers thereon. Portions of the conductive layer are exposed by solder mask patterns 330 at respective surfaces of the package substrates 375 to define conductive patterns 373. The conductive patterns 373 may define respective leads for RF signal connections along the surfaces of the package substrates 375, such that the respective leads do not extend beyond edges of the electrically insulating member 377. The solder mask patterns 330 may be defined by a screen printing process using conventional methods.

As shown in the side view of FIG. 9, a solder material 340 is applied to the conductive patterns 373 exposed by the solder mask patterns 330 on the respective surfaces of the substrates 375. More particularly, a stencil 910 is provided on the respective surfaces of the substrates 375 to expose the conductive patterns 373, and a squeegee blade 909 is used to apply the solder material 340 to the conductive patterns 373 exposed by the stencil 910. The solder material 340 may be a paste including metal (e.g., tin (Sn)) solder particles suspended in a thick fluid medium or flux. Excess flux may be cleaned from the surfaces of the substrates 375. Using such a screen printing and stencil method, the solder material 340 can be applied onto a large panel 379 including multiple package substrates 375 (e.g., a PCB array), such that several semiconductor components (i.e., transistor dies 210 and/or surface mount passive components 378) may be placed and reflowed in the same process step.

FIG. 10 illustrates completion of the assembly process of the packaged RF power device 370, 470. As shown in FIG. 10, the transistor dies 210 and discrete surface mount passive components 378 (e.g., SiC transistors, SiC IPDs, and other SMD components) are provided on the respective surfaces of the package substrates 375 and are attached to the surfaces of the package substrates 375 including the solder material 340 thereon. A solder reflow process is performed to attach and align the transistor dies 210 and the passive components 378 on the conductive patterns 373 at the respective surfaces of the substrates 375, such that respective terminals of the transistor die 210 and the passive components 378 are electrically connected to respective ones of the conductive patterns 373 by the solder material 340 and are aligned by the solder mask patterns 330. That is, the solder mask patterns 330 (having the solder material 340 deposited thereon using the stencil 910) may extend around or outline respective ones of the conductive patterns 373, such that, when the solder material is reflowed at a temperature sufficient to melt the solder material 340, the solder mask patterns 330 may be used to self-align and center the transistor die 210 and the passive components 378 in desired positions such that the respective terminals thereof are electrically connected to the respective ones of the conductive patterns 373.

In some embodiments, an environmental protection layer 390 (not visible in FIG. 10) may be applied to cover the transistor dies 210 and the passive components 378 (and electrical connections therebetween). For example, a spray-on process may be used to conformally deposit the protective layer 390, such as a scratch coat or other protective layer, after performing the solder reflow process to attach the components 210 and 378 to the substrates 375. The respective substrates 375 may be singulated from the panel 379 to provide the RF transistor amplifier packages 370, 470.

Figure 11:
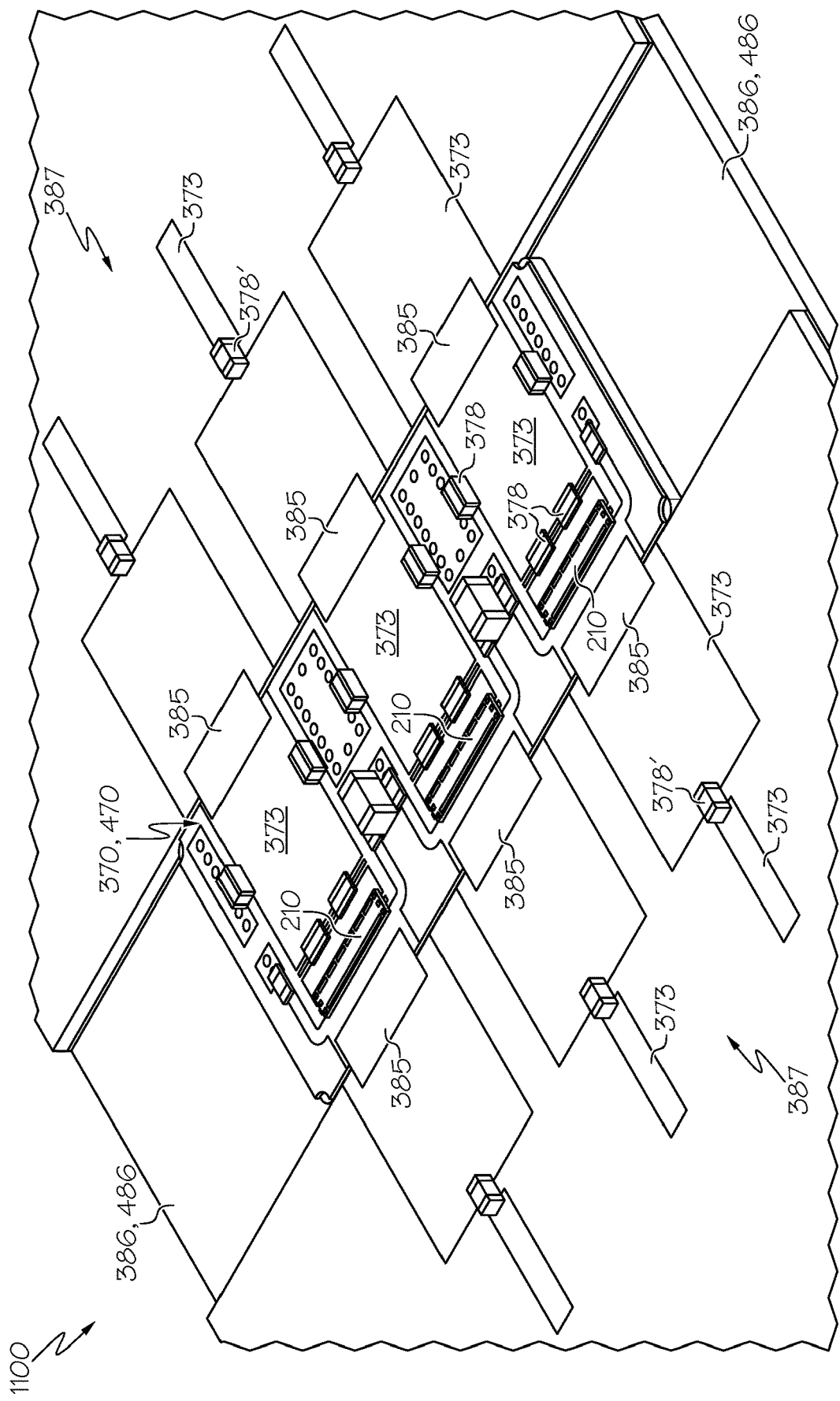
FIG. 11 is a schematic perspective view illustrating package-board connections between the transistor amplifier package and an RF circuit board.

FIG. 11 is a schematic perspective view illustrating package-board connections between the RF power amplifier packages 370, 470 and a substrate 387 of an external RF circuit board 300, 400 in an RF amplifier application 1100. As shown in FIG. 11, the RF circuit board 300, 400 includes a conductive base structure 386, 486 (e.g., a copper or aluminum heat sink) and a substrate 387 including conductive layers 373 thereon. Additional surface mount electrical components 378' (e.g., passive and/or reactive SMDs, IPDs, or interconnect structures) may be provided on the conductive traces/routing 373.

The packaged RF power device 370, 470 is mounted within an opening in the substrate 387 such that the bottom surface of the package 370, 470 (i.e., the flange 376 in the package 370 or the bottom surface of the package substrate 375 in the package 470) contacts the conductive base structure 386, 486, with the package substrate 375 confined within the opening in the substrate 387 of the RF circuit board 300, 400. The respective leads (i.e., 372, 374) defined by the conductive patterns 373 are free of electrical connections that extend beyond edges of the electrically insulating member 377 of the package substrate 375.

Figure 12:
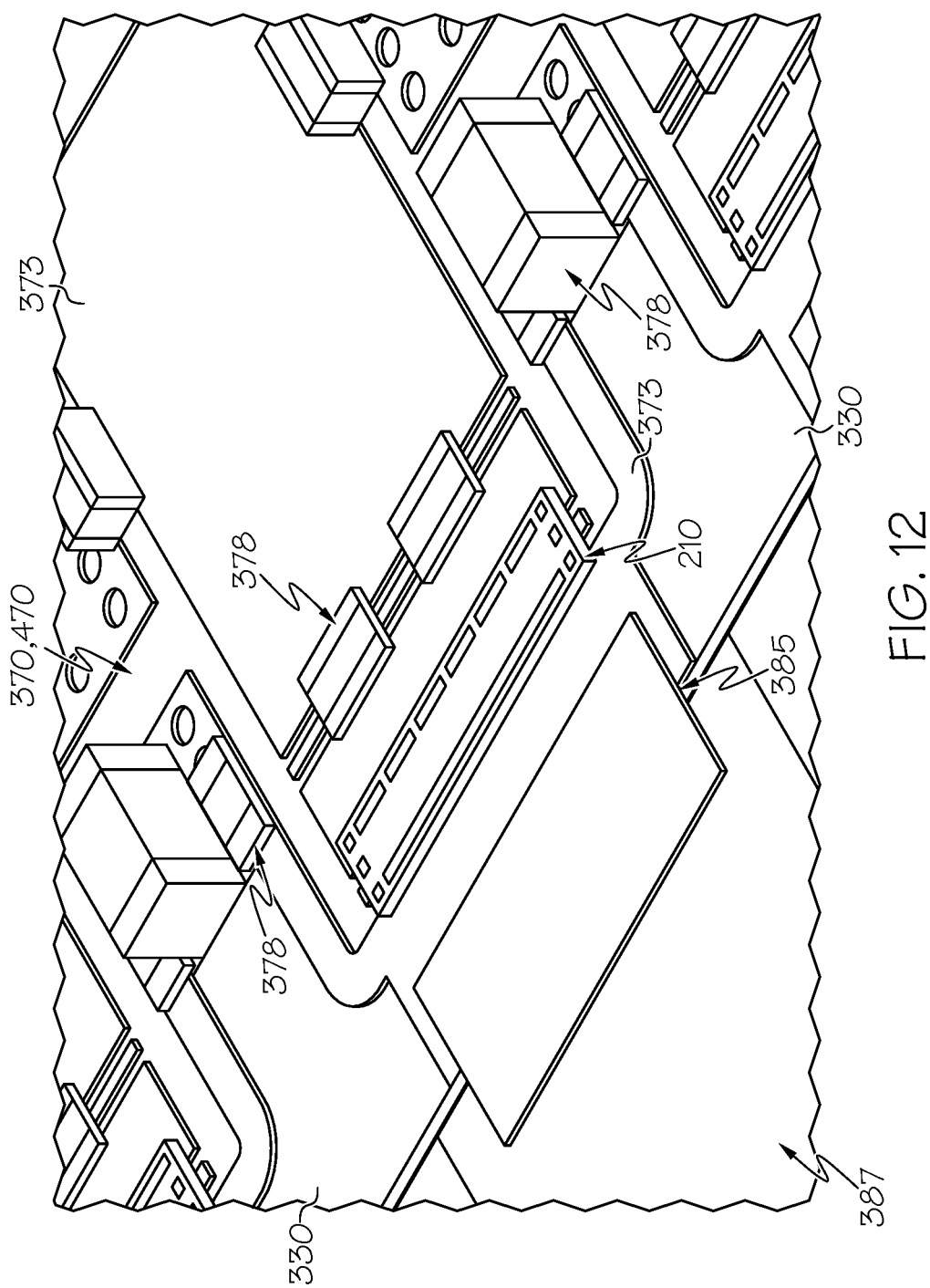
FIG. 12 is an enlarged schematic perspective view illustrating the package-board connections of FIG. 11.

FIG. 12 is an enlarged schematic perspective view illustrating the package-board connections between the RF power amplifier packages 370, 470 and a substrate 387 of an external RF circuit board 300, 400 of FIG. 11 in greater detail. As shown in FIG. 12, conductive surface mount components 385 (e.g., copper shims or other flexible conductive material) are used to provide a conductive bridge between the conductive patterns 373 of the RF circuit board substrate 387 and the respective leads provided by conductive patterns 373 of the packaged RF power device substrate 375. Additionally or alternatively, surface mount electrical components (e.g., passive and/or reactive SMDs or IPDs) may be used to provide the conductive bridge between the RF circuit board substrate 387 and the packaged RF power device substrate 375.

Accordingly, multiple RF amplifier packages 370, 470 can be assembled and built in panel form 379. The surface mount active components 210 and/or passive components 378 may be placed with an automatic chip-shooter after the solder material 340 is applied using a common stencil 910 for multiple package substrates 375, and the entire panel 379 may be reflowed in the same solder reflow process to complete the attachment of the active components 210 and/or passive components 378 to the conductive patterns 373 exposed by the solder mask patterns 330 at the respective surfaces of the package substrates 375. The use of surface mount active components 210 and passive components 378 using solder-based attachment on a surface of a substrate 375, 387 (free of a protective lid or overmold member thereon) may allow for greater flexibility for pre-matching circuit designs and/or design topologies, at the supplier and/or customer level. For example, the passive components 378, 378' may be reconfigurable to provide desired impedance characteristics (e.g., to implement input/inter-stage/output impedance matching circuits and/or harmonic termination circuits for the transistor die(s) 210) and/or desired frequency performance.

Embodiments of the present disclosure may be used, for example, in various RF power products, e.g., for 5G, base station, or aerospace and defense (A&D) applications. Particular embodiments of the present disclosure may be used in various cellular infrastructure (CIFR) RF power products (including, but not limited to 5 W, 10 W, 20 W, 40 W, 60 W, 80 W and different frequency bands) e.g., for 5G and base station applications, including macro (e.g., 20-80 W and different frequency bands) average power applications. Embodiments of the present disclosure may also be applied to radar and monolithic microwave integrated circuit (MMIC)-type applications, or any other applications that use Si or SiC IPD components and/or transistors.

The transistor amplifiers described herein may include transistor die(s) defining gallium nitride-based high electron mobility transistors (HEMTs), and/or defining silicon-based laterally diffused metal oxide semiconductor (LDMOS) transistors. The transistor die(s) may be configured to operate in at least a portion of one or more of the 2.5-2.7 GHz, 3.4-4.2 GHz, or 5.1-5.8 GHz frequency bands, and/or at frequencies above 10 GHz.

Referring again to FIG. 2B, a semiconductor structure 130 that may be used in transistor amplifier packages described herein, such as a semiconductor structure for a Group III nitride semiconductor HEMT, may be formed on a substrate 322 such as a silicon carbide substrate, silicon substrate, or a sapphire substrate. The substrate 322 may be a semi-insulating silicon carbide substrate that may be, for example, the 4H polytype of silicon carbide. Other silicon carbide candidate polytypes may include the 3C, 6H, and 15R polytypes. The substrate 322 may be a High Purity Semi-Insulating (HPSI) substrate, available from Cree, Inc. The term "semi-insulating" is used descriptively herein, rather than in an absolute sense.

Although silicon carbide may be used as a substrate material, embodiments of the present application may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. In some embodiments of the present disclosure, the SiC bulk crystal of the substrate 322 may have a resistivity equal to or higher than about $1 \times 10^5$ ohm-cm at room temperature. The substrate 322 can be a SiC wafer, and the HEMT device can be formed, at least in part, via wafer-level processing, and the wafer can then be diced to provide a plurality of individual HEMTs.

A channel layer 324 is formed on the upper surface of the substrate 322 (or on the optional layers described further herein), and a barrier layer 326 is formed on an upper surface of the channel layer 324. The channel layer 324 and the barrier layer 326 may each be formed by epitaxial growth in some embodiments. Techniques for epitaxial grown of Group III nitrides have been described in, for example, U.S. Pat. Nos. 5,210,051, 5,393,993, and 5,523,589, the disclosures of which are also incorporated by reference herein in their entireties. The channel layer 324 may have a bandgap that is less than the bandgap of the barrier layer 326 and the channel layer 324 may also have a larger electron affinity than the barrier layer 326. The channel layer 324 and the barrier layer 326 may include Group III-nitride based materials.

In some embodiments, the channel layer 324 may be a Group III nitride, such as $Al_xGa_{1-x}N$, where $0 \leq x < 1$, provided that the energy of the conduction band edge of the channel layer 324 is less than the energy of the conduction band edge of the barrier layer 326 at the interface between the channel and barrier layers 324, 326. In certain embodiments of the present disclosure, x=0, indicating that the channel layer 324 is GaN. The channel layer 324 may also be other Group III-nitrides such as InGaN, AlInGaN or the like. The channel layer 324 may be undoped ("unintentionally doped") and may be grown to a thickness of greater than about 0.002 µm. The channel layer 324 may also be a multi-layer structure, such as a superlattice or combinations of GaN, AlGaN or the like. The channel layer 324 may be under compressive strain in some embodiments.

With respect to HEMT devices, a 2DEG layer is induced in the channel layer 324 at a junction between the channel layer 324 and the barrier layer 326. The 2DEG layer acts as a highly conductive layer that allows conduction between the source and drain regions of the device that are beneath the source contact 156 and the drain contact 154, respectively. The channel layer 324 and the barrier layer 326 form the semiconductor structure 130.

While semiconductor structure 130 is shown with channel layer 324 and barrier layer 326 for purposes of illustration, semiconductor structure 130 may include additional layers/structures/elements such as a buffer and/or nucleation layer (s) between channel layer 324 and substrate 322, and/or a cap layer on barrier layer 326. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an AlN buffer layer may be formed on the upper surface of the substrate 322 to provide an appropriate crystal structure transition between the silicon carbide substrate 322 and the remainder of the HEMT device. Additionally, strain balancing transition layer(s) may also and/or alternatively be provided as described, for example, in commonly assigned U.S. Pat. No. 7,030,428, the disclosure of which is incorporated herein by reference as if set forth fully herein.

A source contact 156 and a drain contact 154 may be formed on an upper surface of the barrier layer 326 and may be laterally spaced apart from each other. A gate contact 152 may be formed on the upper surface of the barrier layer 326 between the source contact 156 and the drain contact 154. The material of the gate contact 152 may be chosen based on the composition of the barrier layer 326, and may, in some embodiments, be a Schottky contact.

The source contact 156 may be coupled to a reference signal such as, for example, a ground voltage. The coupling to the reference signal may be provided by a via 166 that extends from a lower surface of the substrate 322, through the substrate 322 to an upper surface of the barrier layer 326. The via 166 may expose a bottom surface of the ohmic portion of the source contact 156. A backside metal layer 126 (also referred to as a backmetal layer) may be formed on the lower surface of the substrate 322 and on sidewalls of the via 166. The backmetal layer 126 may be patterned such that electrically isolated portions thereof directly contact the ohmic portion of the source contact 156, the gate bus 146, and/or the drain bus 148.

Still referring to FIG. 2B, the HEMT device 110 may include a first insulating layer 350 and a second insulating layer 355. The first insulating layer 350 may directly contact the upper surface of the semiconductor structure 130 (e.g., contact the upper surface of the barrier layer 326). The second insulating layer 355 may be formed on the first insulating layer 350. It will also be appreciated that more than two insulating layers may be included in some embodiments. The first insulating layer 350 and the second insulating layer 355 may serve as passivation layers for the HEMT device.

The source contact 156, the drain contact 154, and the gate contact 152 may be formed in the first insulating layer 350. In some embodiments, at least a portion of the gate contact 152 may be on the first insulating layer. In some embodiments, the gate contact 152 may be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 355 may be formed on the first insulating layer 350 and on portions of the drain contact 154, gate contact 152, and source contact 156.

In some embodiments, field plates 360 may be formed on the second insulating layer 355. At least a portion of a field plate 360 may be on the gate contact 152. At least a portion of the field plate 360 may be on a portion of the second insulating layer 355 that is between the gate contact 152 and the drain contact 154. Field plates and techniques for forming field plates are discussed, by way of example, in U.S. Pat. No. 8,120,064, the disclosure of which is hereby incorporated herein in its entirety by reference.

In some embodiments, metal contacts 365 may be disposed in the second insulating layer 355. The metal contacts 365 may provide interconnection between the drain contact 154, gate contact 152, and source contact 156 and other parts of the HEMT device. Respective ones of the metal contacts 365 may directly contact respective ones of the drain contact 154 and/or source contact 156. The metal contacts 365 may contain metal or other highly conductive material, including, for example, copper, cobalt, gold, and/or a composite metal.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A transistor amplifier package, comprising:
   a package substrate comprising conductive patterns exposed by solder mask patterns at a surface thereof;
   at least one transistor die comprising a semiconductor structure attached to the surface of the package substrate by a solder paste on the surface of the package substrate such that respective gate, drain, and/or source terminals of the at least one transistor die are aligned by the solder mask patterns and are electrically connected to respective ones of the conductive patterns by the solder paste.

2. The transistor amplifier package of claim 1, wherein the at least one transistor die comprises:
   a patterned backside metal layer on a bottom surface of the semiconductor structure, wherein the patterned backside metal layer comprises the respective gate, drain, and/or source terminals; and
   a barrier metal layer between the patterned backside metal layer and the solder paste on the surface of the substrate.

3. The transistor amplifier package of claim 2, wherein the barrier metal layer comprises at least one of nickel, titanium, and or an alloy thereof.

4. The transistor amplifier package of claim 1, wherein the at least one transistor die comprises:
   a plurality of conductive pillars on a top surface of the semiconductor structure adjacent a transistor active region and electrically coupled to the respective gate, drain, and/or source terminals,
   wherein the solder paste is between the conductive pillars and the surface of the substrate.

5. The transistor amplifier package of claim 1, further comprising:
   one or more discrete passive electrical components attached to the surface of the package substrate by the solder paste and aligned by the solder mask patterns.

6. The transistor amplifier package of claim 5, wherein the one or more discrete passive electrical components and/or the at least one transistor die are spaced apart from one another by respective gaps of less than about 0.25 mm, or about 0.25 mm to about 0.1 mm.

7. The transistor amplifier package of claim 5, wherein respective terminals of the one or more discrete passive electrical components are electrically connected to the respective gate, drain, and/or source terminals of the at least one transistor die by the respective ones of the conductive patterns.

8. The transistor amplifier package of claim 5, wherein at least one of the respective gate, drain, and/or source terminals is on a top surface of the semiconductor structure adjacent a transistor active region, and further comprising:

at least one wire bond electrically connecting the at least one of the respective gate, drain, and/or source terminals on the top surface to a respective terminal of the one or more discrete passive electrical components.

9. The transistor amplifier package of claim 5, wherein the one or more discrete passive electrical components define a portion of an input, inter-stage, or output impedance matching circuit or harmonic termination circuit.

10. The transistor amplifier package of claim 1, wherein the conductive patterns provide respective leads for radio frequency ("RF") signal connections that are substantially coplanar with the surface of the package substrate having the at least one transistor die attached thereto.

11. The transistor amplifier package of claim 10, wherein the package substrate comprises an electrically insulating member, wherein the respective leads are free of electrical connections that extend substantially beyond edges of the electrically insulating member.

12. The transistor amplifier package of claim 10, wherein the conductive patterns comprise an embedded conductive member extending through the electrically insulating member, and the source terminal of the at least one transistor die is attached to the embedded conductive member by the solder paste at the surface of the package substrate.

13. The transistor amplifier package of claim 12, wherein the package is free of a thermally conductive package submount.

14. The transistor amplifier package of claim 12, further comprising:

a thermally conductive package submount having the package substrate thereon, wherein the respective leads do not extend substantially beyond edges of the thermally conductive package submount.

15. The transistor amplifier package of claim 1, further comprising:

an environmental protection layer conformally extending on one or more surfaces of the at least one transistor die.

16. The transistor amplifier package of claim 15, wherein the transistor amplifier package is free of an overmold or lid member on the at least one transistor die.

17. The transistor amplifier package of claim 1, wherein the transistor amplifier package is free of wire bonds.

18. A transistor amplifier, comprising:

a substrate comprising conductive patterns at a surface thereof;

at least one transistor die comprising a semiconductor structure and a patterned backside metal layer on a bottom surface thereof, wherein the patterned backside metal layer is attached to the surface of the substrate by a solder paste on the surface of the substrate such that respective gate, drain, and/or source terminals of the at least one transistor die are electrically connected to respective ones of the conductive patterns by the solder paste; and a barrier metal layer between the patterned backside metal layer and the solder paste.

19. A transistor amplifier, comprising:

a substrate comprising conductive patterns exposed by solder mask patterns at a surface thereof and providing respective leads for signal connections;

at least one transistor die comprising a semiconductor structure attached to the surface of the substrate by a solder paste on the surface of the substrate; and one or more discrete passive electrical components attached to the surface of the substrate by the solder paste, wherein the one or more discrete passive electrical components and/or the at least one transistor die are spaced apart from one another on the surface of the substrate by respective gaps of less than about 0.25 mm.

20. A method of fabricating transistor amplifier packages, the method comprising:

providing a plurality of package substrates respectively comprising conductive patterns exposed by solder mask patterns at respective surfaces thereof;

applying a solder paste to the respective surfaces of the package substrates using a stencil thereon, wherein the stencil exposes the conductive patterns of the package substrates;

providing at least one transistor die comprising a semiconductor structure on the respective surfaces of the package substrates; and performing a solder reflow process to attach and align the at least one transistor die on the respective surfaces such that respective gate, drain, and/or source terminals of the at least one transistor die are aligned by the solder mask patterns and are electrically connected to respective ones of the conductive patterns by the solder paste.

21. The transistor amplifier package of claim 1, wherein the at least one transistor die comprises a radio frequency ("RF") transistor die.

* * * * *